United States Patent
Sun

(10) Patent No.: US 10,079,240 B2
(45) Date of Patent: Sep. 18, 2018

(54) FERROELECTRIC RANDOM-ACCESS MEMORY ON PRE-PATTERNED BOTTOM ELECTRODE AND OXIDATION BARRIER

(71) Applicant: Cypress Semiconductor Corporation, San Jose, CA (US)

(72) Inventor: Shan Sun, Monument, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/351,268

(22) Filed: Nov. 14, 2016

(65) Prior Publication Data
US 2017/0162249 A1 Jun. 8, 2017

Related U.S. Application Data

(63) Continuation of application No. 15/065,410, filed on Mar. 9, 2016, now Pat. No. 9,515,075.

(60) Provisional application No. 62/212,273, filed on Aug. 31, 2015.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 27/11507* | (2017.01) |
| *H01L 49/02* | (2006.01) |

(52) U.S. Cl.
CPC ........ *H01L 27/11507* (2013.01); *H01L 28/75* (2013.01)

(58) Field of Classification Search
CPC ............................ H01L 27/11507; H01L 28/75

USPC ........................................................ 257/295
See application file for complete search history.

(56) References Cited

U.S. PATENT DOCUMENTS

| | | | |
|---|---|---|---|
| 5,506,816 A | 4/1996 | Hirose et al. | |
| 6,066,868 A * | 5/2000 | Evans, Jr. | ......... H01L 27/11502 257/295 |
| 6,097,636 A | 8/2000 | Nojima | |
| 6,180,974 B1 | 1/2001 | Okutoh et al. | |
| 6,288,594 B1 | 9/2001 | Manstretta et al. | |
| 6,509,601 B1 * | 1/2003 | Lee | .................. H01L 27/11502 257/306 |

(Continued)

FOREIGN PATENT DOCUMENTS

| | | |
|---|---|---|
| CN | 103137194 A | 6/2013 |
| WO | 1996036050 A1 | 11/1996 |
| WO | 2013169501 A1 | 11/2013 |

OTHER PUBLICATIONS

International Search Report for International Application No. PCT/US16/42849 dated Oct. 7, 2016; 5 pages.

(Continued)

*Primary Examiner* — David S Blum

(57) ABSTRACT

Structure and method of fabrication of F-RAM cells are described. The F-RAM cell include ferroelectric capacitors forming over and with a pre-patterned barrier structure which has a planarized/chemically and/or mechanically polished top surface. The pre-patterned barrier structure includes multiple oxygen barriers having a structure of a bottom electrode layer over an oxygen barrier layer. The bottom electrode layer forms at least a part of the bottom electrode of the ferroelectric capacitor formed thereon.

20 Claims, 22 Drawing Sheets

(56) References Cited

U.S. PATENT DOCUMENTS

| | | | |
|---|---|---|---|
| 6,570,787 B1 | 5/2003 | Wang et al. | |
| 6,627,931 B1 | 9/2003 | Casagrande et al. | |
| 6,635,498 B2 | 10/2003 | Summerfelt et al. | |
| 6,656,748 B2 | 12/2003 | Hall et al. | |
| 6,687,151 B2 | 2/2004 | Endo et al. | |
| 6,713,342 B2 | 3/2004 | Celii et al. | |
| 6,773,930 B2 | 8/2004 | Summerfelt et al. | |
| 6,773,986 B2 | 8/2004 | Bruchhaus et al. | |
| 6,828,161 B2 | 12/2004 | Summerfelt et al. | |
| 6,893,912 B2 | 5/2005 | Lung | |
| 6,914,282 B2 | 7/2005 | Lung | |
| 6,947,328 B1 | 9/2005 | Smidt et al. | |
| 7,042,705 B2 | 5/2006 | Zhuang et al. | |
| 7,266,023 B2 | 9/2007 | Shuto | |
| 7,345,946 B1 | 3/2008 | Chapman et al. | |
| 7,460,430 B2 | 12/2008 | Kim et al. | |
| 7,643,372 B2 | 1/2010 | Yamagami | |
| 7,697,367 B2 | 4/2010 | Hara | |
| 7,745,863 B2 | 6/2010 | Adkisson et al. | |
| 7,764,569 B2 | 7/2010 | Chen | |
| 7,940,580 B2 | 5/2011 | Schreiber et al. | |
| 8,093,070 B2 | 1/2012 | Celii et al. | |
| 8,144,523 B2 | 3/2012 | Kobatake | |
| 8,518,792 B2 | 8/2013 | Sun et al. | |
| 8,552,515 B2 | 10/2013 | Sun et al. | |
| 8,570,809 B2 | 10/2013 | Hirose et al. | |
| 8,755,239 B2 | 6/2014 | Holla et al. | |
| 8,901,970 B2 | 12/2014 | Gonzalez | |
| 8,947,970 B2 | 2/2015 | Pelley et al. | |
| 8,953,380 B1 | 2/2015 | Yu et al. | |
| 8,995,219 B2 | 3/2015 | Romanovskyy | |
| 9,111,944 B2 | 8/2015 | Sun | |
| 9,293,179 B2 | 3/2016 | Wu | |
| 9,305,995 B1 | 4/2016 | Sun | |
| 9,466,347 B1 | 10/2016 | Pasotti et al. | |
| 2003/0072188 A1 | 4/2003 | Rosendale | |
| 2003/0146741 A1 | 8/2003 | Endo et al. | |
| 2004/0159874 A1* | 8/2004 | Tsuchiya | H01L 27/11502 257/306 |
| 2004/0212014 A1 | 10/2004 | Fujito et al. | |
| 2005/0004718 A1* | 1/2005 | Issa | G06F 17/5031 700/304 |
| 2008/0001258 A1 | 1/2008 | Ema et al. | |
| 2008/0181025 A1 | 7/2008 | Ueda | |
| 2009/0075399 A1 | 3/2009 | Sakato et al. | |
| 2009/0268527 A1 | 10/2009 | Duuren et al. | |
| 2010/0039872 A1 | 2/2010 | Park et al. | |
| 2010/0054032 A1 | 3/2010 | Sandre | |
| 2010/0187584 A1* | 7/2010 | Matsuda | H01L 27/11507 257/295 |
| 2010/0301346 A1* | 12/2010 | Miyairi | H01L 29/78621 257/72 |
| 2010/0301436 A1 | 12/2010 | Sashida | |
| 2012/0218817 A1 | 8/2012 | Kang et al. | |
| 2012/0320658 A1 | 12/2012 | Wang et al. | |
| 2013/0149794 A1* | 6/2013 | Wang | H01L 27/11507 438/3 |
| 2014/0016400 A1 | 1/2014 | Pelley et al. | |
| 2014/0050012 A1 | 2/2014 | Guillemenet et al. | |
| 2014/0062580 A1 | 3/2014 | Lee et al. | |
| 2014/0112072 A1 | 4/2014 | Tsao et al. | |
| 2014/0119120 A1 | 5/2014 | Lee | |
| 2014/0184300 A1 | 7/2014 | Wu | |
| 2014/0204676 A1 | 7/2014 | Kim et al. | |
| 2014/0292377 A1 | 10/2014 | Gonzalez | |
| 2015/0004718 A1 | 1/2015 | Sun et al. | |
| 2015/0021679 A1 | 1/2015 | Tsair et al. | |
| 2015/0071000 A1 | 3/2015 | Namai et al. | |
| 2015/0072441 A1* | 3/2015 | Sun | H01L 28/55 438/3 |
| 2015/0206893 A1* | 7/2015 | Sun | H01L 27/11507 257/532 |
| 2015/0221658 A1* | 8/2015 | Wang | H01L 21/324 257/532 |

OTHER PUBLICATIONS

Kazushi Amanuma, et al., "Capacitor-on-metal/via-stacked-plug (CMVP) memory cell for 0.25 μm CMOS embedded FeRAM", Electron Devices Meeting, Dec. 1998.

L. Trupina et al., Iridium layer as oxygen barrier and growth substrate for oriented PZT thin films, Journal of Optoelectronics and Advanced Materials vol. 9, No. 5, May 2007, p. 1508-1510.

Nak-Won Jang, et al., "Highly Stable Etch Stopper Technology for 0.25 μm 1 Transistor 1 Capacitor (1T1C) 32 Mega-Bit Ferroelectric Random Access Memory (FRAM)", Japanese Journal of Applied Physics, vol. 42, Part 1, No. 4B, published Apr. 1, 2003; 2 pages.

NEC Develops Technology for 0.25-micron CMOS Logic Embedded FeRAM Memory Cell, NEC website: http://www.nec.co.jp/press/en/9812/0701.html, published Dec. 7, 1998.

USPTO Notice of Allowance for U.S. Appl. No. 15/065,410 dated May 13, 2016; 12 pages.

USPTO Notice of Allowance for U.S. Appl. No. 15/065,410 dated Aug. 29, 2016; 12 pages.

Written Opinion of the International Searching Authority for International Application No. PCT/US16/42849 dated Oct. 7, 2016, 5 pages.

International Search Report for International Application No. PCT/US2016/018525 dated May 3, 2016; 2 pages.

Kyoung-Rok Han, et al., "4-bit/cell SONOS Flash Memory Cell with Recessed Channel Structure", School of Electrical Engineering and Computer Science, Kyungpook National University, Daegu, Korea; 2 pages.

Liyan Jin et al., "Design of DC-DC Converter for Flash Memory IPs", Department of electronic engineering, Chanwon National University, Changwon, South Korea; published Jan. 2013; 4 pages.

SIPO Office Action for Application No. 201680004513.7 dated Dec. 21, 2017; 6 pages.

USPTO Non-Final Rejection for U.S. Appl. No. 14/859,134 dated Apr. 7, 2016; 11 pages.

USPTO Notice of Allowance for U.S. Appl. No. 14/859,134 dated Jun. 24, 2016; 8 pages.

USPTO Notice of Allowance for U.S. Appl. No. 14/859,134 dated Nov. 2, 2016; 8 pages.

Written Opinion of the International Searching Authority for International Application No. PCT/US2016/018525 dated May 3, 2016; 13 pages.

SIP Office Action for Application 201680035827.3 dated May 29, 2018; 3 pages.

* cited by examiner

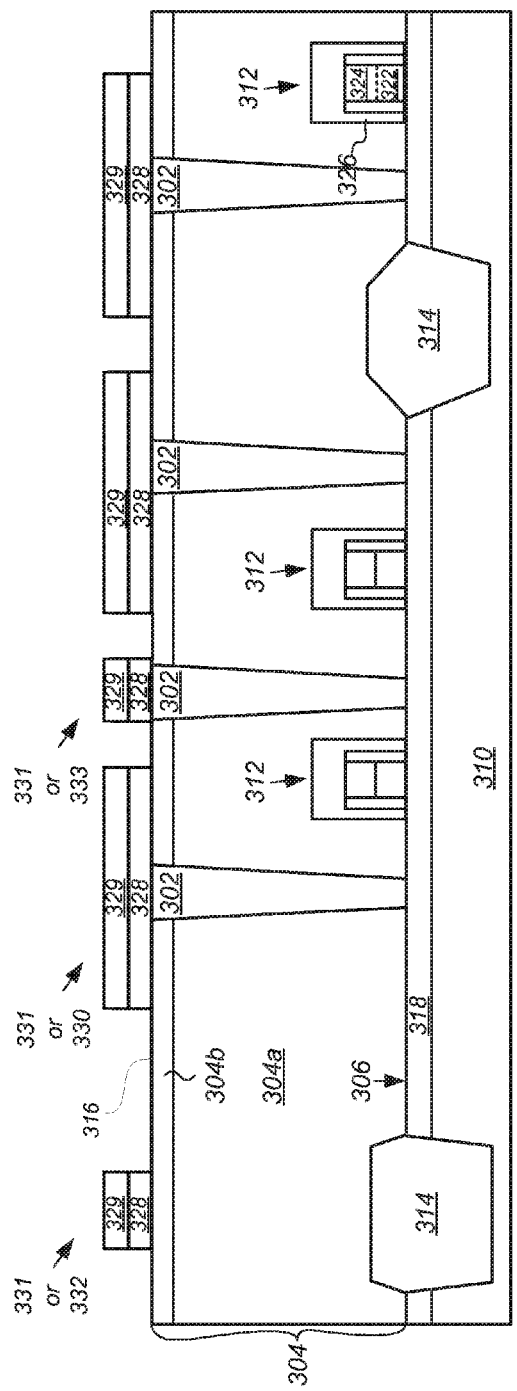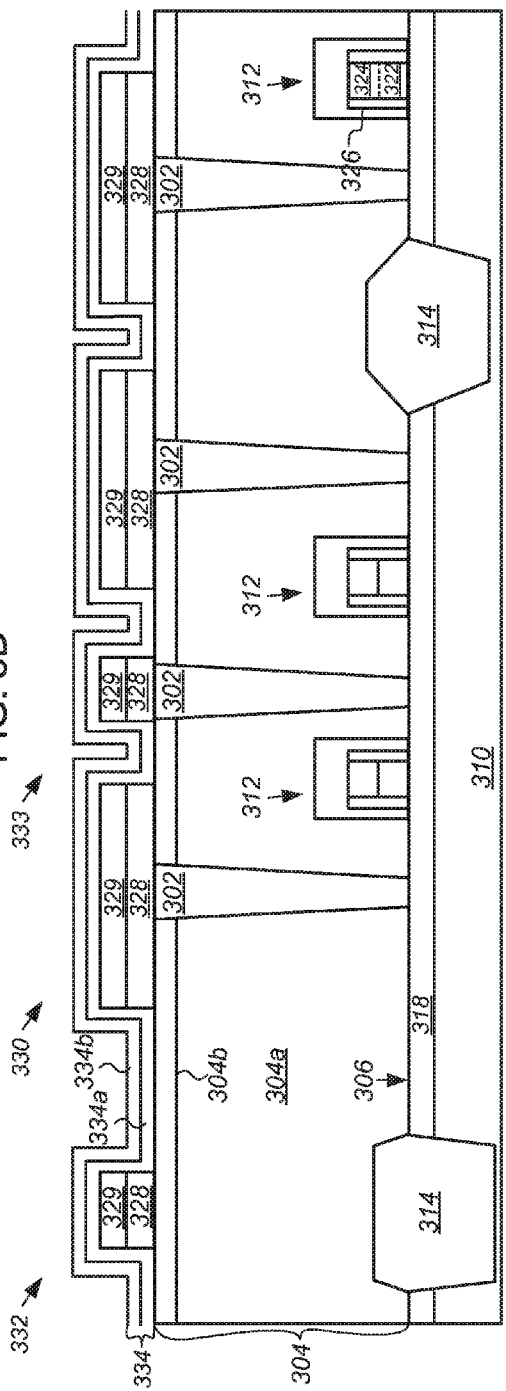
FIG. 3D
FIG. 3E

FERROELECTRIC RANDOM-ACCESS MEMORY ON PRE-PATTERNED BOTTOM ELECTRODE AND OXIDATION BARRIER

CROSS-REFERENCE TO RELATED APPLICATIONS

This application is a Continuation of U.S. patent application Ser. No. 15/065,410, now U.S. Pat. No. 9,515,075, filed Mar. 9, 2016, which claims the benefit of U.S. Provisional Application No. 62/212,273, filed on Aug. 31, 2015, all of which are incorporated by reference herein in their entirety.

TECHNICAL FIELD

The present disclosure relates generally to semiconductor devices, and more particularly to ferroelectric random access memories (F-RAM) including embedded or integrally formed ferroelectric capacitors and complementary metal-oxide-semiconductor (CMOS) transistors and methods for fabricating the same.

BACKGROUND

Ferroelectric random-access memories (F-RAM) are considered non-volatile (NV) memory and may include a grid or an array of storage elements or cells, each including an NV element, such as at least one ferroelectric capacitor. The F-RAM circuit may also include one or more associated transistors to select the cell and control reading or writing to the NV elements.

When an external electric field is applied across the ferroelectric material of a ferroelectric capacitor in the cell, dipoles in the material align with the field direction. After the electric field is removed, the dipoles retain their polarization state. Data is stored in the cells as one of two possible electric polarization states in each data storage cell. For example, in a one transistor-one capacitor (1T1C) cell, a "1" may be encoded using a negative remnant polarization, and a "0" is encoded using a positive remnant polarization, or vice versa.

SUMMARY

Non-volatile memory cells including complementary metal-oxide-semiconductor (CMOS) transistors and embedded ferroelectric capacitors formed according to methods of the present disclosure minimizes changes to the CMOS process flow, reducing cost of fabricating ferroelectric random access memories (F-RAM), lowering defect density and enabling tighter design rules.

In one embodiment, the method includes forming a contact extending through a first dielectric layer on a surface of a substrate. A barrier structure is formed over the contact. Generally, forming the barrier structure includes: (i) depositing a bottom electrode layer over an oxygen barrier layer, and over a top surface of the first dielectric layer and the contact; (ii) patterning both the bottom electrode and oxygen barrier layer to form the barrier structure over the contact; (iii) depositing a second dielectric layer over the patterned barrier layer and the first dielectric layer, and (iv) planarizing the second dielectric layer to expose a top surface of the barrier structures. A ferroelectric stack (ferro-stack) is deposited over the barrier structure. The ferro-stack includes a bottom electrode transition layer deposited on the barrier structure, a ferroelectric layer on the bottom electrode layer and a top electrode on the ferroelectric layer. Finally, the ferro-stack is patterned to form a ferroelectric capacitor with the bottom electrode layer of the barrier structure, wherein the barrier layer is conductive and a bottom electrode of the ferroelectric capacitor is electrically coupled to the contact through the barrier layer.

In another embodiment, forming the barrier structure further includes encapsulating the patterned bottom electrode and barrier layers with a hydrogen ($H_2$) barrier layer prior to depositing the second dielectric layer, and planarizing the second dielectric layer includes removing the $H_2$ barrier layer on the top surface of the barrier structure to expose the patterned barrier layer.

Optionally, patterning the bottom electrode and barrier layers may include patterning the bottom electrode and barrier layers to concurrently form local interconnections (LI) and landing pads.

BRIEF DESCRIPTION OF THE DRAWINGS

Embodiments of the present document will be understood more fully from the detailed description that follows, the accompanying drawings, and the appended claims provided below, where:

DETAILED DESCRIPTION

Embodiments of F-RAM including embedded or integrally formed ferroelectric capacitors and metal-oxide-semiconductor field effect transistors (MOSFET) and methods of fabricating the same are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present document. In other instances, well-known semiconductor design and fabrication techniques and processes have not been described in particular detail to avoid unnecessarily obscuring the present document. Reference throughout this specification to "an embodiment" means that a particular feature, structure, material, or characteristic described in connection with the embodiment is included in at least one embodiment of the present document. Thus, the appearances of the phrase "in an embodiment" in various places throughout this specification are not necessarily referring to the same embodiment of the present document. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed or formed over or under another layer may be directly in contact with the other layer or may have one or more intervening layers. Moreover, one layer deposited or disposed or formed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
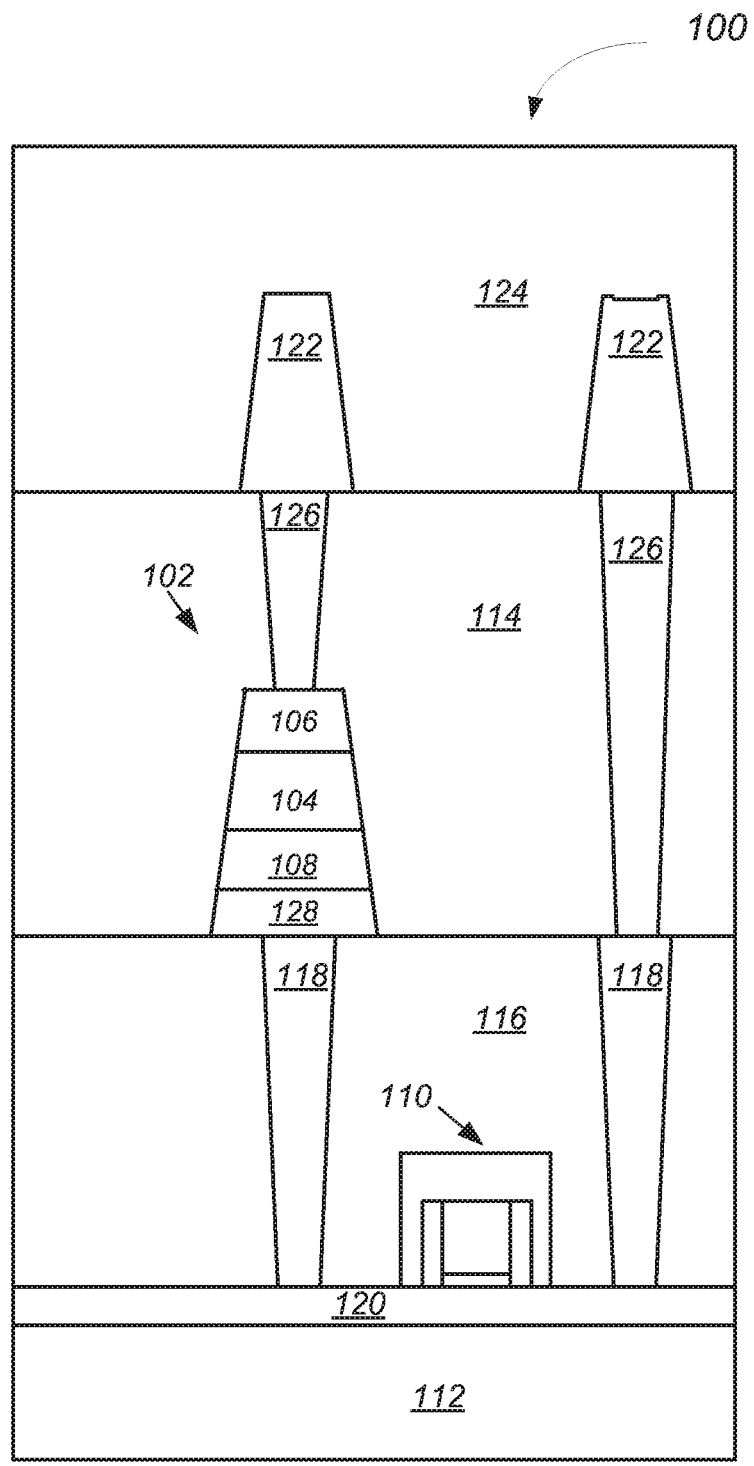
FIG. 1 is a block diagram illustrating a cross-sectional view of a portion of a ferroelectric random access memory (F-RAM) cell fabricated according to one embodiment.

FIG. 1 illustrates a cross-sectional view of a portion of an F-RAM cell 100 fabricated according to one embodiment. As best shown in FIG. 1, F-RAM cell 100 may be referred to as having a capacitor on plug structure, in which ferroelectric capacitor 102 is disposed on contact 118 (plug). Referring to FIG. 1, ferroelectric capacitor 102 may include a ferroelectric material layer 104 between a top or upper electrode 106 and a bottom or lower electrode 108. Transistor 110 in F-RAM cell 100 may be MOSFET or FET fabricated on substrate 112 using a standard or baseline complementary-metal-oxide-semiconductor (CMOS) process flow, involving the formation and patterning of conducting, semiconducting, and/or dielectric materials. The composition of these materials, as well as the composition and concentration of processing reagents, and temperature used in such a CMOS process flow are stringently controlled for each operation to ensure the resultant MOSFETs function properly and according to system design requirements. Thus, in some fabrication methods of F-RAM 100, ferroelectric capacitor 102 is fabricated in a separate F-RAM layer 114 overlying a CMOS layer 116 in which the MOSFETs 110 are fabricated and connected thereto by one or more contacts or plugs 118. The contacts extend to a diffusion region 120 of the MOS transistor 110 in the substrate 112 and/or by a separate wiring layer 122 fabricated in another dielectric layer 124 overlying the F-RAM layer 114 and connected to the MOSFETs 110 and ferroelectric capacitor 102 through additional contacts 126.

Materials and processes used to fabricate MOSFETs 110, contacts 118 and wiring layer 122 may not be compatible with ferroelectric capacitor process flow, and may detrimentally impact their performance. For example, when fabricating ferroelectric capacitor 102 over contact 118 in the CMOS layer 116, processes and/or materials used to fabricate the ferroelectric capacitor 102 may oxidize metal elements, such as tungsten, used in the contacts 118 and affect their electrical conductivity. Thus, ferroelectric capacitors 102 formed over such contacts 118 typically include an oxidation or oxygen barrier 128 between the contact 118 and bottom electrode 108. In one embodiment, top electrode 106, ferroelectric material layer 104, bottom electrode 108, and oxygen barrier 128 may be patterned concurrently or in a single step to form ferroelectric capacitors 102 stack in a single process step.

It will be understood by those skilled in the art that the above described method of fabricating F-RAM cell 100, in particular patterning to form ferroelectric capacitors 102 stack in a single process step, may increase an aspect ratio of ferroelectric capacitors 102, which is height of stacks/gap (space) between stacks, as well as the overall size or height of the F-RAM cell 100. Moreover, it may require several extra masks and processing steps, all of which may increase fabrication time, costs, and defect density, lowering a yield of working memories.

Figure 2A:
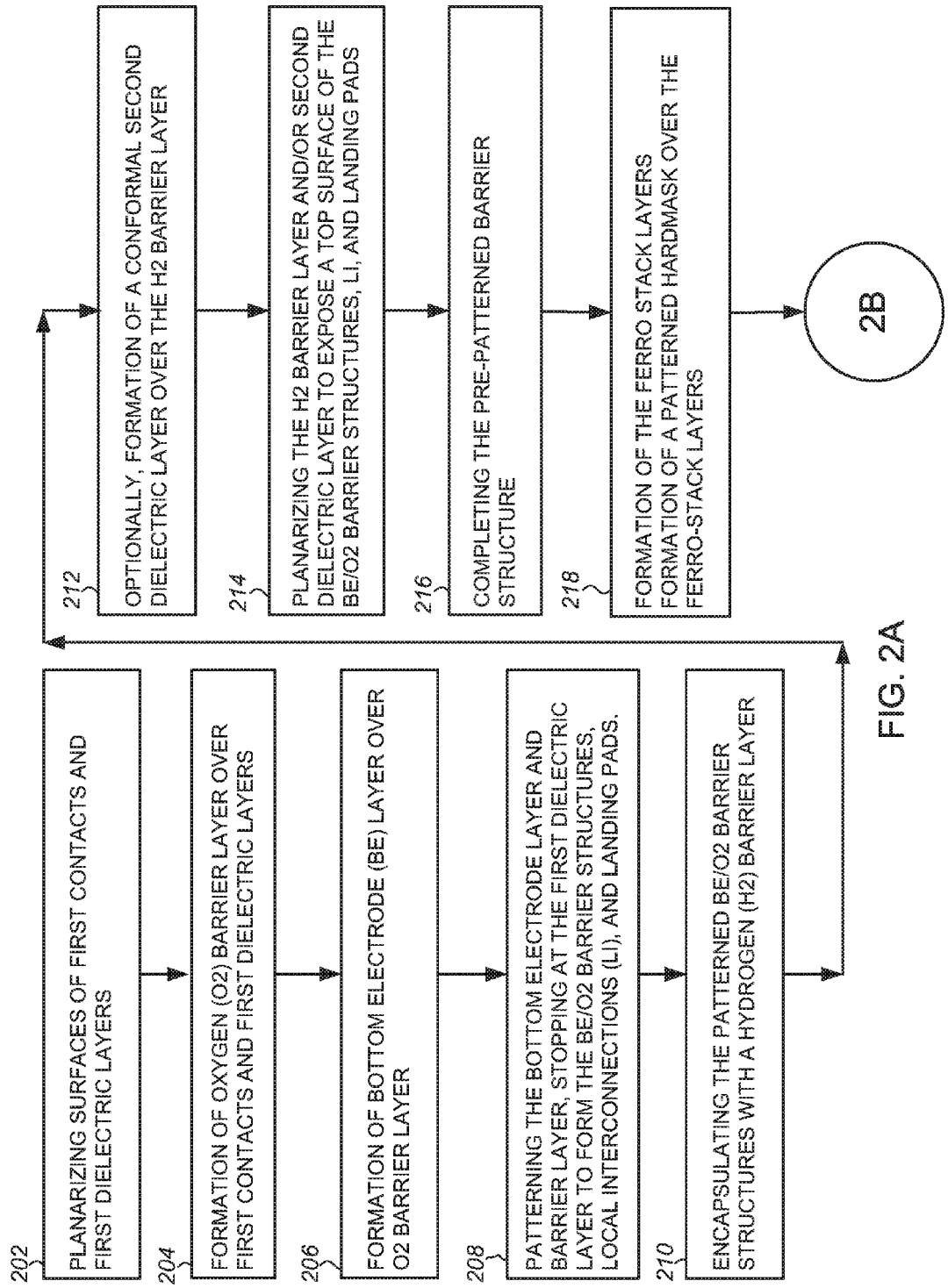
FIGS. 2A and 2B are a flowchart illustrating an embodiment of a method for fabricating a ferroelectric random access memory (F-RAM) including at least one embedded ferroelectric capacitor and metal-oxide-semiconductor field effect transistors (MOSFET)
Figure 2B:
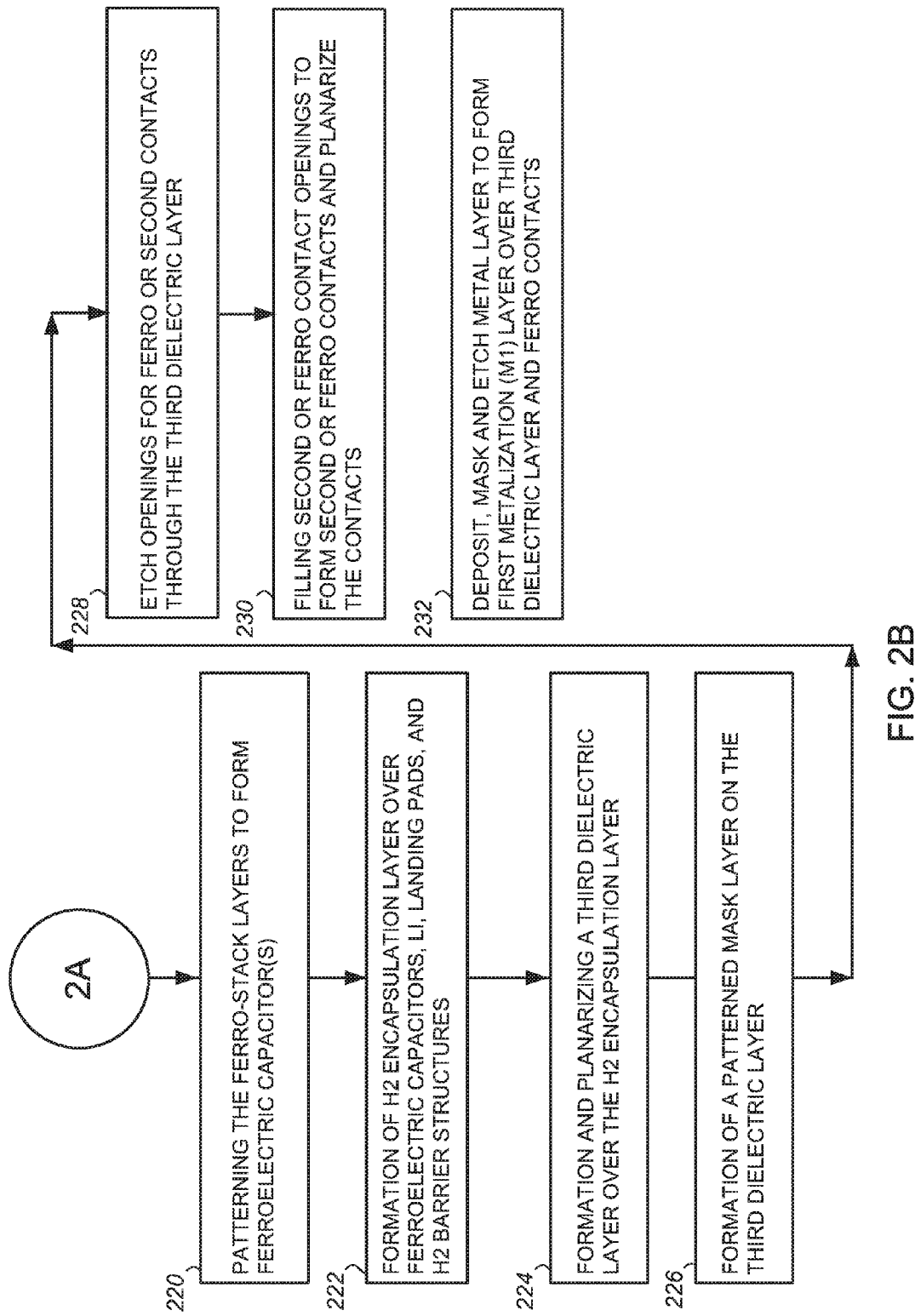
Figure 3A:
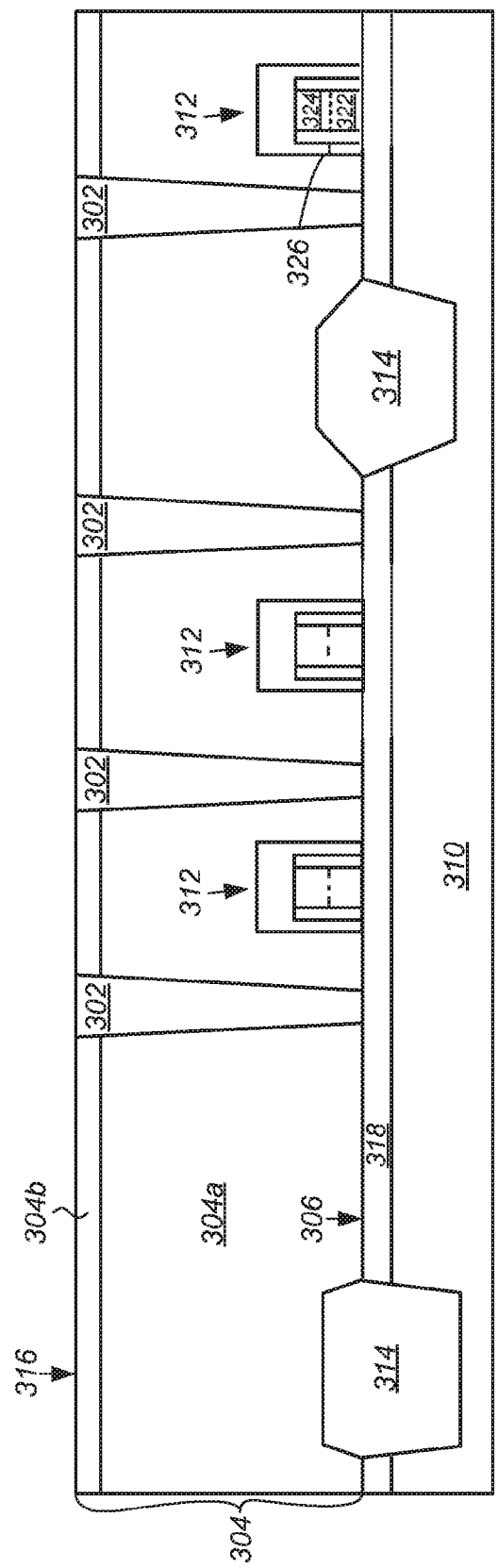
FIGS. 3A-3Q are block diagrams illustrating cross-sectional views of a portion of an F-RAM cell during fabrication thereof according to the method of FIGS. 2A and 2B.

Another embodiment of a method for integrating or embedding a ferroelectric capacitor into a standard or baseline CMOS process flow for fabricating an F-RAM will now be described in detail with reference to FIGS. 2A and 2B, and to FIGS. 3A-3Q. FIGS. 2A and 2B are a combined flowchart illustrating an embodiment of a method for fabricating a ferroelectric random access memory (F-RAM) including at least one embedded ferroelectric capacitor on plug and metal-oxide-semiconductor (MOS) transistor. FIGS. 3A-3Q are block diagrams illustrating cross-sectional views of a portion of an F-RAM cell 300 during fabrication thereof according to the method of FIGS. 2A and 2B. FIG. 3R is a block diagram illustrating cross-sectional views of a portion of a completed F-RAM cell 300 including a ferroelectric capacitor fabricated according to the method of FIGS. 2A and 2B.

Referring to FIG. 2A and FIG. 3A, the process begins with planarizing surfaces of first contact plugs or contacts 302 and a first dielectric layer 304 or complementary metal-oxide-semiconductor (CMOS) layer after formation of a CMOS circuit on a surface 306 of a substrate or wafer 310. The CMOS circuit may include one or more MOS transistors 312 separated by one or more isolation structures 314, such as shallow trench isolations (STI). The first dielectric layer 304 is disposed overlying and at least partly encapsulating MOS transistors 312. The first contacts 302 may extend through the first dielectric layer 304 from a top surface 316 thereof to a diffusion region 318, such as a source or a drain, of MOS transistors 312 on the substrate 310 (block 202).

In addition to a source and a drain, diffusion regions 318 may also include a channel region for MOS transistors 312. Generally, substrate 310 and, hence, diffusion regions 318, may be composed of any material suitable for semiconductor device fabrication. In one embodiment, substrate 310 is a bulk substrate composed of a single crystal of a material which may include, but is not limited to, silicon, germanium, silicon-germanium or an III-V compound semiconductor material. In another embodiment, substrate 310 may include a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. The top epitaxial layer is composed of a single crystal layer which may include, but is not limited to, silicon (i.e. to form a silicon-on-insulator (SOI) semiconductor substrate), germanium, silicon-germanium and an III-V compound semiconductor material.

The substrate 310 and, hence, the channel region, may include dopant impurity atoms. In one embodiment, channel region is doped P-type and, in an alternative embodiment, channel region is doped N-type. Source and drain diffusion regions 318 in substrate 310 may have opposite conductivity type (i.e. P- or N-type) to channel region. For example, in one embodiment substrate 310 and, hence, channel region, is composed of boron-doped single-crystal silicon having a boron concentration in the range of $1\times10^{15}$-$1\times10^{19}$ atoms/ cm$^3$, which may make it doped P-type. Source and drain diffusion regions 318 are composed of phosphorous- or arsenic-doped regions having a concentration of N-type dopants in the range of $5\times10^{16}$ to $5\times10^{19}$ atoms/cm$^3$, which may render MOS transistors 312 N-channel MOS (NMOS). In one embodiment, source and drain diffusion regions 318 may have a depth in the substrate 310 in the range of 80 to 200 nanometers (nm). In accordance with an alternative embodiment of the present disclosure, source and drain diffusion regions 318 are P-type doped regions while substrate 310 and channel region is an N-type doped region, which may render MOS transistors 312 P-channel MOS (PMOS).

Each MOS transistor 312 may include a gate oxide 322 formed on the surface 306 of substrate 310, a gate layer 324 formed on gate oxide 322, and one or more sidewall spacers 326 isolating gate layer 324 from first dielectric layer 304. Additionally, although not shown in this figure, it will be understood by those skilled in the art that gate layer 324 is generally electrically coupled to an overlying local interconnection (LI) or a metallization layer, which will be described in more detail below.

The first dielectric layer 304 may include a single layer of dielectric material or multiple layers of dielectric material as in the embodiment best shown in FIG. 3A. For example, in one embodiment, first dielectric layer 304 includes a lower or bottom first dielectric layer 304a including phosphosilicate glass (PSG) formed or deposited by a chemical vapor deposition (CVD) process, such as plasma, low pressure or atmospheric CVD, and an upper or top first dielectric layer 304b including silicon dioxide, deposited by low pressure CVD (LPCVD) tool using tetraethyl-orthosilicate (TEOS) based process gas or precursors.

The first contacts 302 may be formed by first performing a contact opening etch step to etch contact openings in the first dielectric layer 304 until the underlying diffusion regions 318 is exposed. It may be followed by filling contact openings formed with a conductive material, such as a refractory metal. The contact opening etch step may be accomplished using standard photolithographic techniques and any suitable wet or dry etching chemistry for etching a silicon oxide layer and/or PSG. Suitable contact opening etch chemistries may include, for example, wet etching using hydrofluoric acid (HF), or gas phase etching (GPE) using a reactive ion etch (RIE) process gas including HF, methanol and/or methyl alcohol (CH$_3$OH). Contact openings formed in the first dielectric layer 304 are filled with the refractory metal. Refractory metal of elements are generally referred to Groups 4, 5 and 6 of the Periodic Table, including titanium (Ti), tantalum (Ta), tungsten (W), and nitrides or alloys thereof, which are resistant to high temperatures. The refractory metal may be deposited, for example, by physical vapor deposition (PVD), such as sputtering or evaporation, or by CVD and electroless plating.

As indicated in step or block 202 of FIG. 2A, once formed the surfaces of the first contacts 302 and first dielectric layer 304 are planarized or polished, for example, using a chemical mechanical polishing (CMP) process. The result of the CMP process is a common planar top surface 316, as best shown in FIG. 3A.

Figure 3B:
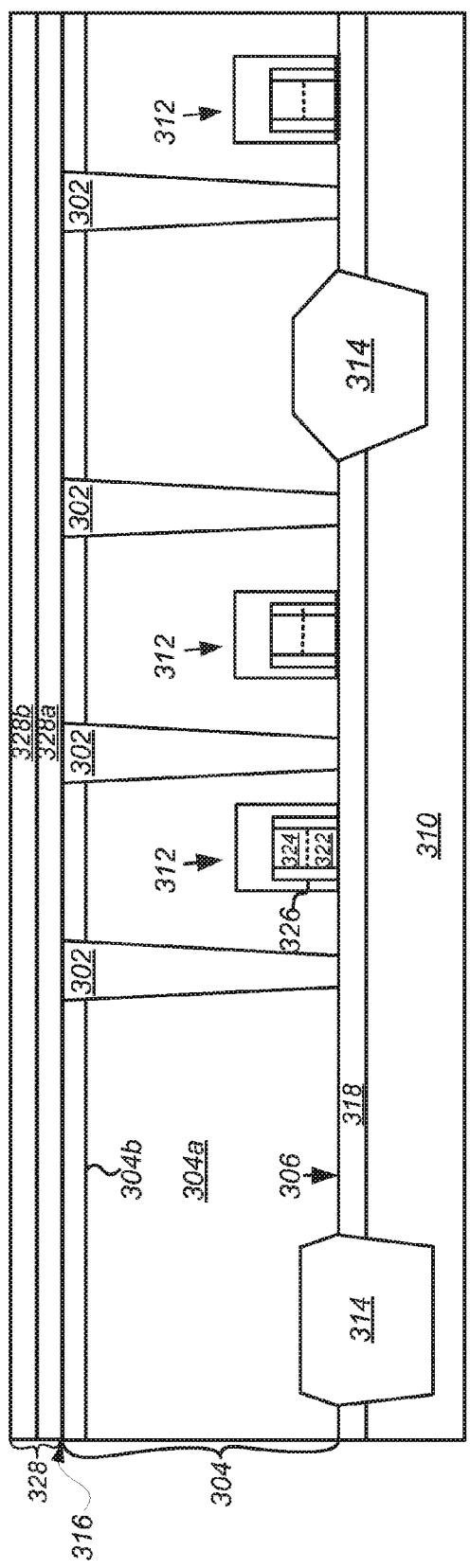
FIG. 3R is a block diagram illustrating a cross-sectional view of a portion of an F-RAM cell fabricated according to the method of FIGS. 2A and 2B.

Referring to FIG. 2A and FIG. 3B, forming a prepatterned barrier structure 400 (not shown in this figure) begins with depositing or forming an oxygen barrier layer 328 over the common planar top surface 316 of the first contacts 302 and first dielectric layer 304 (block 204). Next, a barrier structure (not shown in this figure) is formed over one or more of the contacts 302 over which a ferroelectric capacitor (not shown in this figure) will be formed. The barrier structure includes materials selected to form a barrier to moisture, lead, oxygen (O$_2$) and/or hydrogen (H$_2$). Generally, the materials selected are electrically conductive. In one embodiment, the O$_2$ barrier layer 328 may include a single layer of a material, such as titanium-aluminum-nitride (TiAlN) having a thickness of from about 0.05 μm to about 0.5 μm, or other appropriate thicknesses, deposited over common planar top surface 316 of the first dielectric layer 304 and contacts 302.

In other embodiments, such as that shown in FIG. 3B, the O$_2$ barrier layer 328 may include multiple layers including a first O$_2$ barrier layer 328a including titanium nitride (TiN) at a thickness of from about 0.03 μm to about 0.2 μm deposited over the common planar top surface 316 of the first dielectric layer 304, and contacts 302, and a second O$_2$ barrier layer 328b including titanium-aluminum-nitride (TiAlN) at a thickness of from about 0.03 μm to about 0.10 μm, or other appropriate thicknesses, deposited over the first O$_2$ barrier layer 328a. Either or both of the first and second O$_2$ barrier layers 328 can be deposited or formed using any suitable deposition method, such as CVD, atomic layer deposition (ALD), or physical vapor deposition (PVD). In another embodiment, the O$_2$ barrier layer 328 may include a single layer of titanium aluminum oxynitride (TiAlO$_x$N$_y$) deposited over the common planar top surface 316 by CVD, ALD, or PVD. A portion of the O$_2$ barrier layer 328 composed of TiAlO$_x$N$_y$ may be relatively oxygen-rich proximate to its top surface and nitrogen-rich proximate to its bottom surface.

Figure 3C:
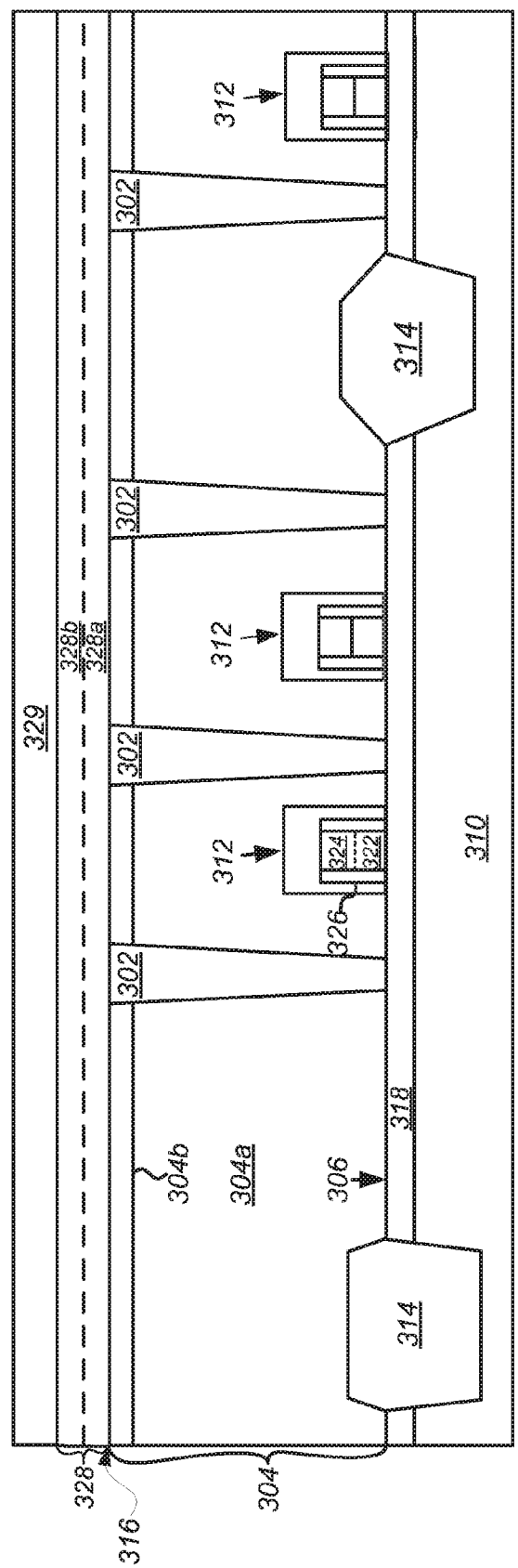

Referring to FIG. 2A and FIG. 3C, the fabrication process continues with bottom electrode layer 329 deposition. The bottom electrode layer 329 may include a single layer of iridium (Ir) having a thickness from about 60 nm to 360 nm, or other appropriate thicknesses, deposited or formed using CVD, ALD or PVD. Alternatively or additionally, bottom electrode layer 329 may include platinum (Pt), deposited or formed using CVD, ALD or PVD. In one embodiment, bottom electrode layer 329 may eventually perform as a bottom electrode of the ferroelectric capacitors (not shown in this figure) which may be formed thereon.

Referring to FIG. 2A and FIG. 3D, a mask (not shown) is formed over the O$_2$ barrier layer 328 and bottom electrode layer 329. Subsequently, the O$_2$ barrier layer 328 and bottom electrode layer 329 are both etched to form one or more patterned barrier stacks 331 as shown in FIG. 3D (block 208). In one embodiment, a number of patterned O$_2$ barrier stacks 331 may be formed in various locations on the common planar top surface 316 of the first contacts 302 and first dielectric layer 304, according to device design and requirements. And according to their locations, subsequent connections, and/or dimensions, each patterned O$_2$ barrier stack 331 may form a part of and eventually be configured as i. an O$_2$ barrier/bottom electrode structure 330 formed over contact 302 for a ferroelectric capacitor (not shown in this figure), ii. a local interconnection (LI) 332, or iii. a landing pad 333 formed over contact 302. In one embodiment, LI 332 electrically connects devices on top of the first dielectric layer 304, through contacts 302 to devices formed in the CMOS or first dielectric layer 304, and/or devices formed above the layer on which the LI is formed through second or ferro contacts 356, as shown in FIG. 3R. Landing pads 333 cap some of the contacts 302 to the underlying diffusion regions 318 and serve as landing pads for additional contacts 356, as shown in FIG. 3R. In one embodiment, there may be a landing pad 333 between two adjacent $O_2$ barrier/bottom electrode structures 330.

In one embodiment, the mask (not shown) used to form the patterned $O_2$ barrier stacks 331 may include a hardmask or a photoresist mask, and the $O_2$ barrier layer 328 and bottom electrode layer 329 may be etched using standard photolithographic and etching techniques. For example, $O_2$ barrier layers 328 composed of TiN or TiAlN or TiAlO$_x$N$_y$ may be dry etched using a mixture of a fluorine based gas, such as sulfur hexafluoride ($SF_6$), nitrogen trifluoride ($NF_3$) or tetrafluoromethane ($CF_4$), a chlorine based gas, such as chlorine ($Cl_2$) or boron trichloride ($BCl_3$), and, optionally, an argon gas to increase the etch rate by sputtering. In one embodiment, suitable chemistries and techniques for etching bottom electrode layer 329 including Ir or Pt may include standard metal etch chemistries, including for example, high density plasma (HDP) etching, and various post-metal etch cleaning processes to prevent corrosion defects.

Next, referring to FIG. 2A and FIG. 3E, forming the pre-patterned barrier structure 400 (not shown in this figure) may further include encapsulating or depositing over the patterned $O_2$ barrier/bottom electrode structures 331 with a hydrogen ($H_2$) barrier layer 334 (block 210). It has been observed that when a ferroelectric capacitor and/or devices or transistors formed above the CMOS circuit, which is in or under the first dielectric layer 304, are exposed to hydrogen introduced, the properties of the devices above the CMOS circuit, such as ferroelectric devices, may be severely degraded. In some embodiments, such as that shown, the $H_2$ barrier layer 334 may include multiple layers including a first $H_2$ barrier layer 334a of aluminum oxide ($Al_2O_3$) having a thickness of from about 100 Å to about 300 Å, or other appropriate thicknesses, deposited over the already patterned $O_2$ barrier stacks 331 and common planar top surface 316 by ALD, and an upper or second $H_2$ barrier layer 334b of silicon nitride ($Si_xN_y$) having a thickness of from about 200 Å to about 1000 Å, or other appropriate thicknesses, and deposited by CVD or ALD. In one alternative embodiment, the $H_2$ barrier layer 334 may be a single layer including silicon nitride ($Si_xN_y$) only.

Figure 3F:
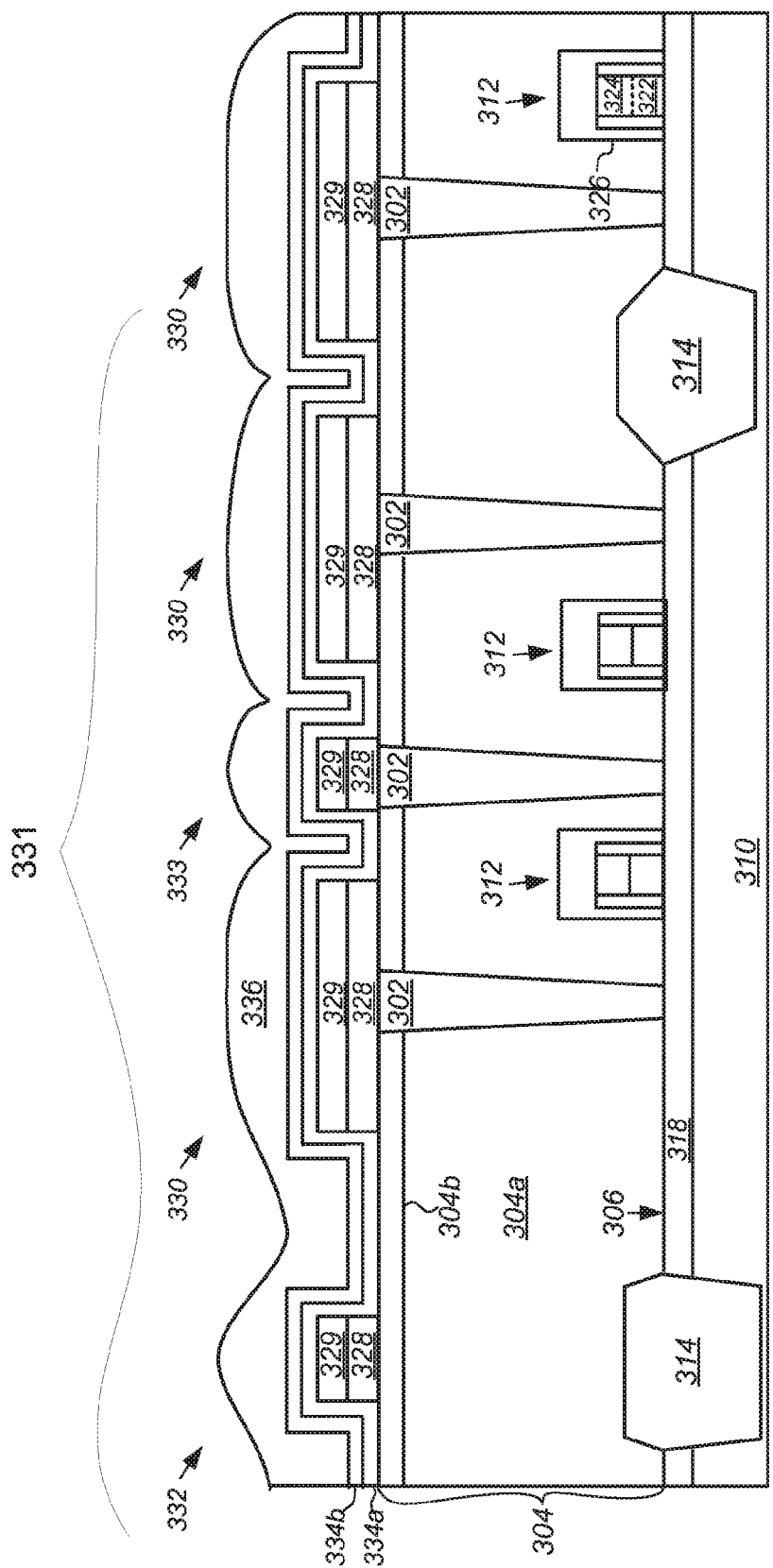

Referring to FIG. 2A and FIG. 3F, optionally a conformal second dielectric layer 336 may be deposited over the $H_2$ barrier layer 334 (block 212). In alternative embodiments, as with the first dielectric layer 304, the second dielectric layer 336 may include one or more layers of a suitable dielectric material compatible with the material of the $H_2$ barrier layer 334 and materials used to fabricate the ferroelectric capacitor and second contacts (not shown in this figure). Suitable dielectric material for second dielectric layer 336 may include phosphosilicate glass (PSG) and silicon oxide. For example, as best shown in FIG. 3F, the second dielectric layer 336 includes a single layer of silicon oxide deposited over a two-layered $H_2$ barrier layer 334 (upper $Si_xN_y$ 334b and lower $Al_2O_3$ 334a $H_2$ barrier layers) by a CVD process, such as plasma, low pressure or atmospheric CVD using tetraethyl-orthosilicate (TEOS) based process gas or precursors to a sufficient for a chemical mechanical polishing (CMP) process. Alternatively, the second dielectric layer 336 includes a single layer of silicon oxide deposited over a single $H_2$ barrier layer 334 of $Si_xN_y$.

Figure 3G:
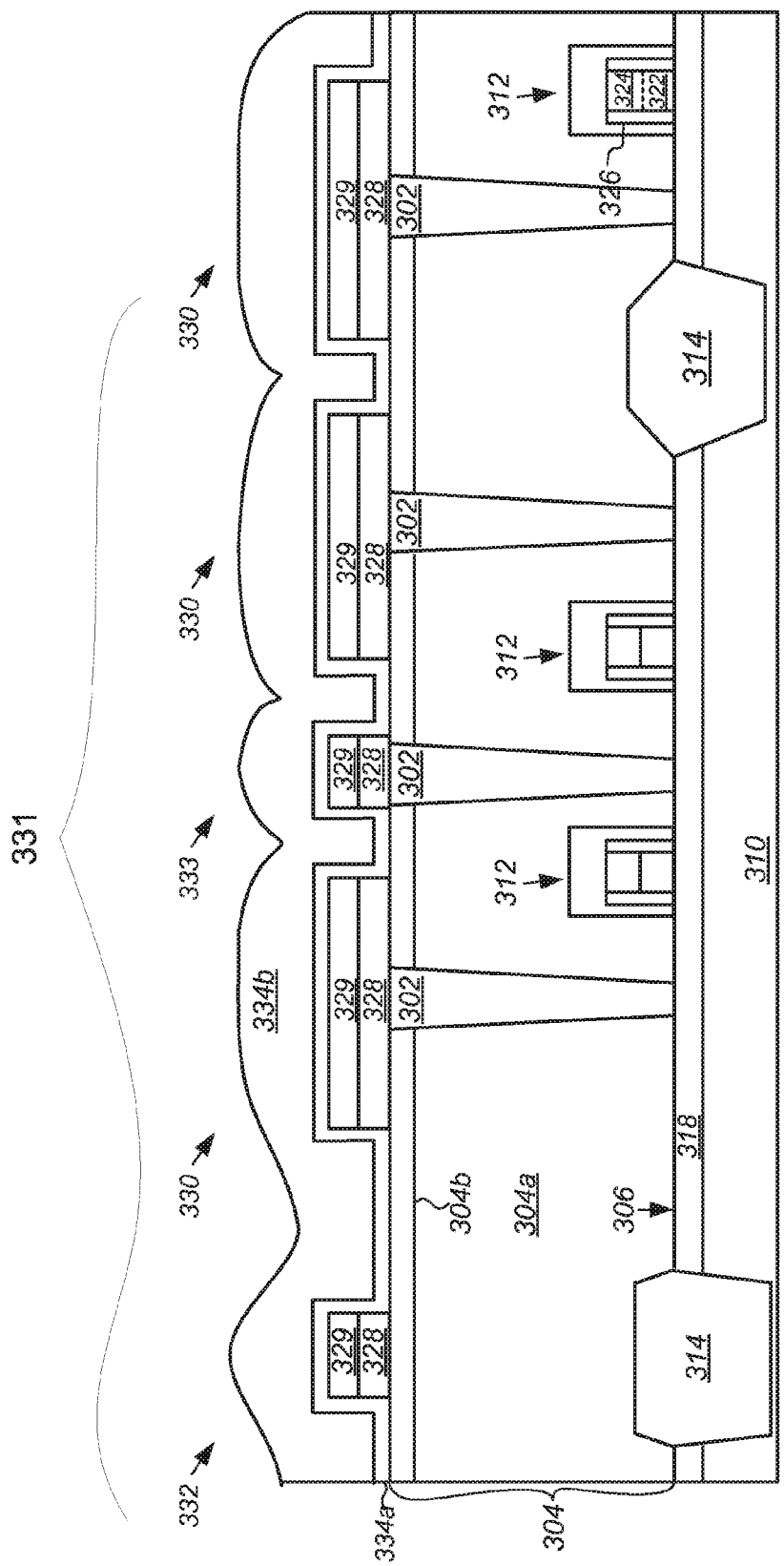

In one alternative embodiment, as best shown in FIG. 3G, second dielectric layer 336 is not deposited and excluded. Instead, the upper $H_2$ barrier layer 334b composed of $Si_xN_y$ is deposited over the bottom $H_2$ barrier layer 334a composed of $Al_2O_3$ CVD or other appropriate deposition methods known in the art.

Figure 3H:
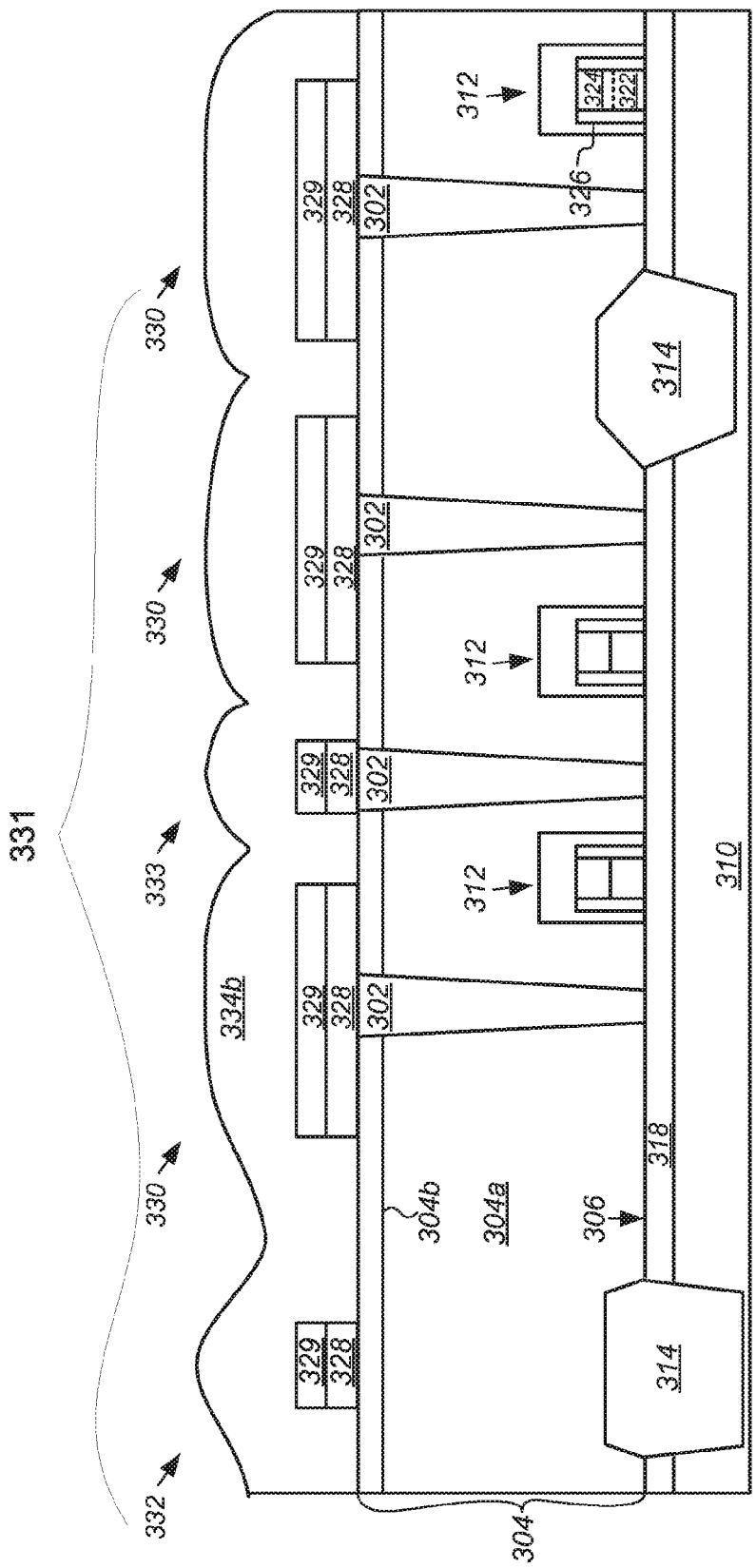

In another alternative embodiment, as best shown in FIG. 3H, the bottom $H_2$ barrier layer 334a of $Al_2O_3$ is omitted and only $H_2$ barrier layer 334b of $Si_xN_y$ is deposited directly on the common planar top surface 316 of the first contacts 302 and first dielectric layer 304 and top surfaces of the patterned $O_2$ barrier stacks 331.

Figure 3I:
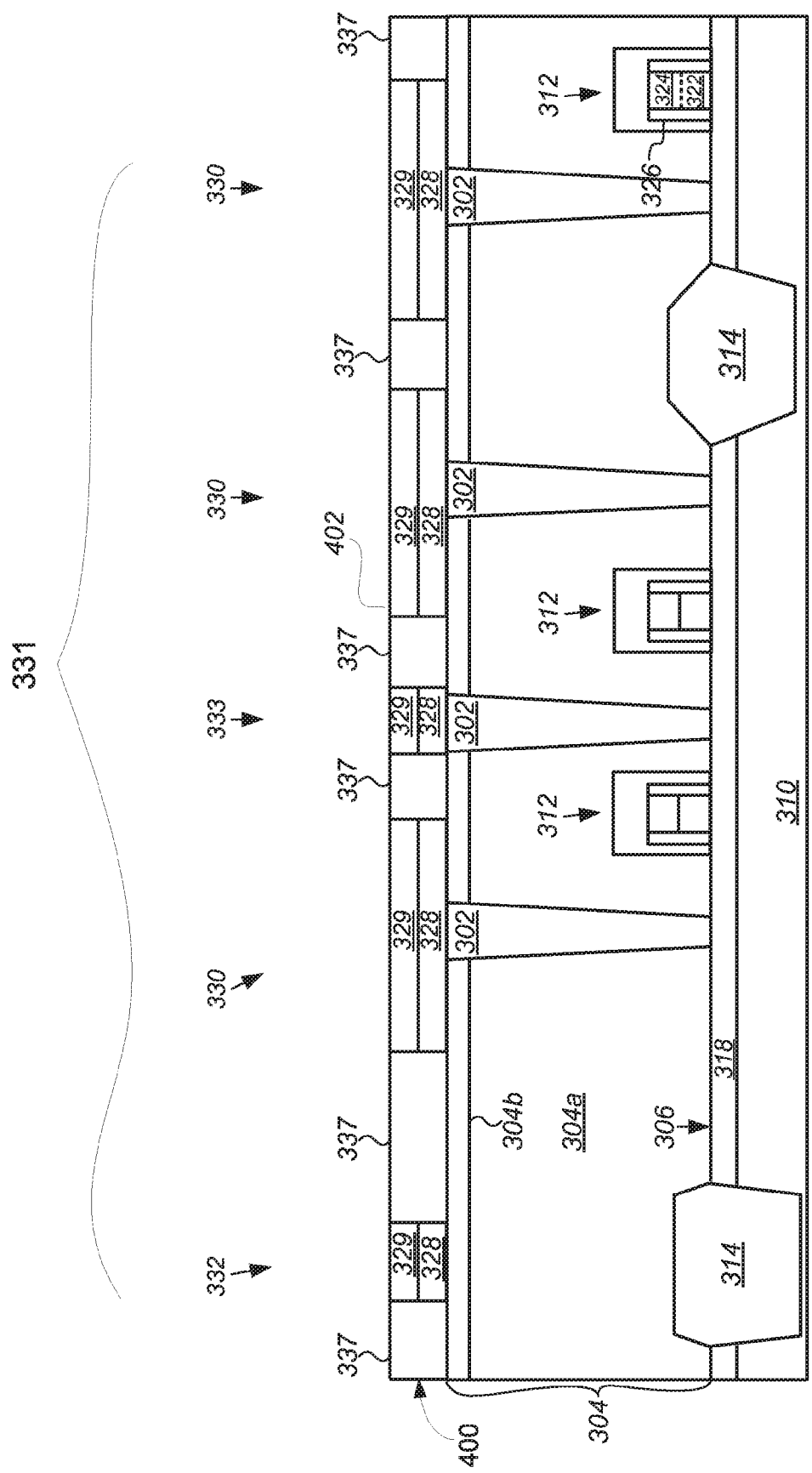

Next, referring to FIG. 2A and FIG. 3I, the formation of the pre-patterned barrier structure 400 is completed when top surfaces of $H_2$ barrier structures 337 and the patterned $O_2$ barrier stack 331 are polished or planarized to form a planarized top barrier surface 402. The planarization, for example, may include a CMP process to expose a top surface of the bottom electrode layer 329 in the patterned $O_2$ barrier stacks 331 (block 214). In one embodiment, the planarization process involves removing the second dielectric layer 336 and/or the $H_2$ barrier layer 334 until a top surface of the bottom electrode layer 329 of at least one patterned $O_2$ barrier stacks 331 is exposed. As explained earlier, each patterned $O_2$ barrier stack 331 may form a prominent part of and perform as either i. an $O_2$ barrier/bottom electrode structure 330 formed over contact 302 for a ferroelectric capacitor (not shown in this figure), ii. a local interconnection (LI) 332, or iii. a landing pad 333 formed over contact 302. Thus, it will be understood that as in the embodiment shown, when the second dielectric layer 336 and/or the $H_2$ barrier layer 334 are removed to expose top surfaces of a plurality of patterned $O_2$ barrier stack 331, various quantities of $O_2$ barrier/bottom electrode structure 330, LI 332, and landing pads 333 are formed and separated from each other by a plurality of newly formed $H_2$ barrier structures 337.

Figure 3J:
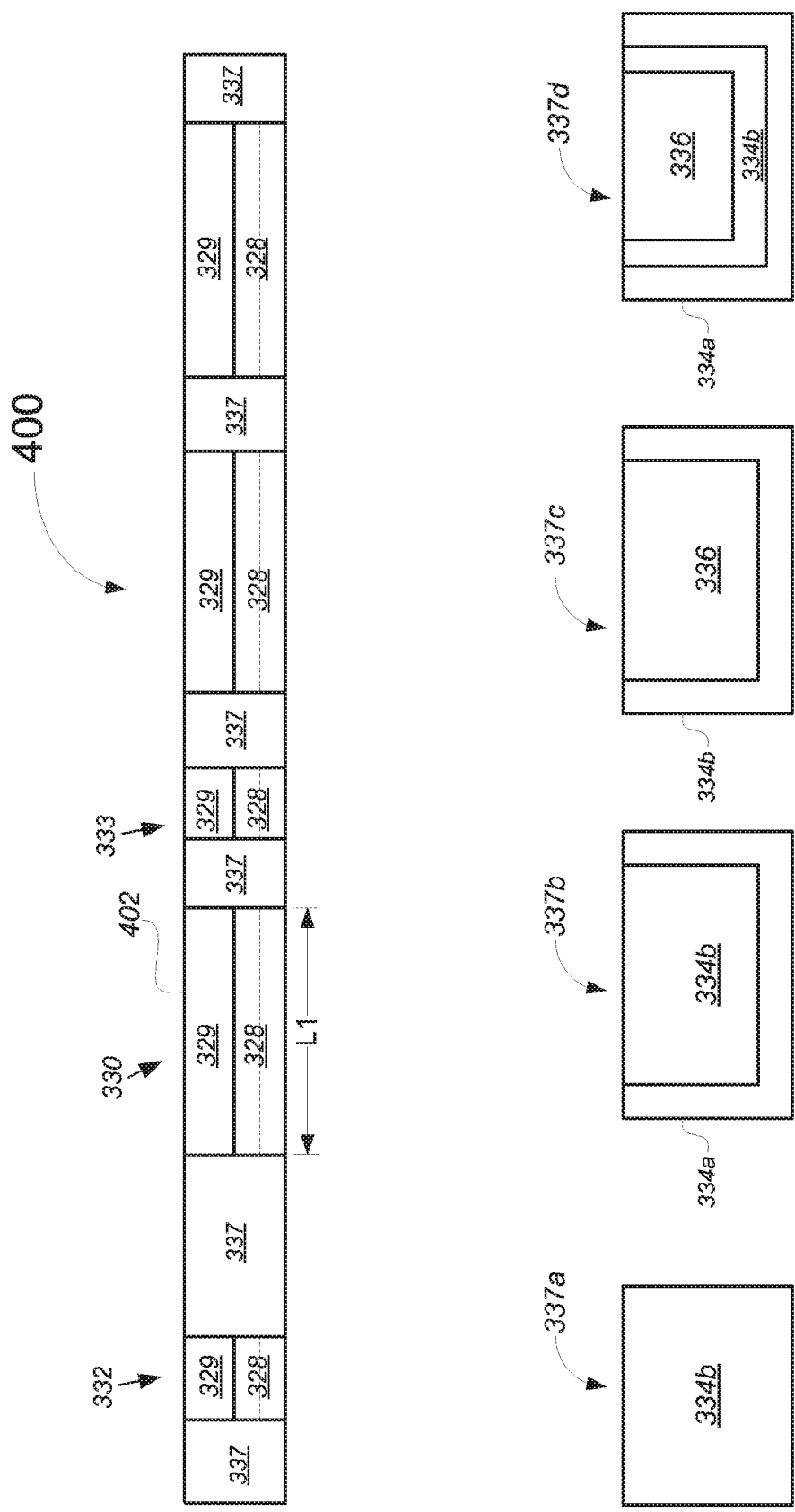

Referring to FIG. 3J, a representative cross-sectional view of the pre-patterned barrier structure 400 fabricated according to the embodiments described in FIGS. 3A-3I is illustrated. In one embodiment, the pre-patterned barrier structure 400 includes a planarized top barrier surface 402, which may be a result of the process steps described in FIG. 2A, block 214. There are multiple $O_2$ barrier/bottom electrode structures 330, LI 332, and landing pads 333 formed on various locations in the pre-patterned barrier structure 400 according to device design and requirements, which may be adjusted by configuring the mask used in block 208. As best shown in FIG. 3J, each of the $O_2$ barrier/bottom electrode structures 330, LI 332, and landing pads 333 may be separated by a $H_2$ barrier structure 337, and include a similar structure, in which patterned bottom electrode layer 329 is disposed on patterned $O_2$ barrier layer 328.

As best shown in FIG. 3J, the mask (not shown) used to form the patterned $O_2$ barrier stacks 331 may be adjusted to configure lengths of $O_2$ barrier/bottom electrode structures 330, LI 332, and landing pads 333. For example, $O_2$ barrier/bottom electrode structure 330 includes a length L1, which may be configurable according to the ferroelectric capacitor (not shown in this figure) formed thereon subsequently, or vice versa.

As also illustrated in FIG. 3J, there may be four alternative embodiments of $H_2$ barrier structure 337a-d. The first alternative embodiment of $H_2$ barrier structures 337a may be fabricated according to the process described in FIG. 3H, in which only the top $H_2$ barrier layer 334b composed of $Si_xN_y$ is disposed. The second alternative embodiment of $H_2$ barrier structures 337b may be fabricated according to the process described in FIG. 3G, in which the top $H_2$ barrier layer 334b composed of $Si_xN_y$ is disposed over the bottom $H_2$ barrier layer 334a composed of $Al_2O_3$. The third and fourth alternative embodiments of $H_2$ barrier structures 337c and 337d may be fabricated according to the process described in FIG. 3F, in which the second dielectric layer 336 may be disposed on the $H_2$ barrier layer 334. The third alternative embodiment of $H_2$ barrier structure 337c includes a single top $H_2$ barrier layer 334b and the fourth alternative embodiment of $H_2$ barrier structure 337d includes a two-layered $H_2$ barrier layer 334 (top and bottom $H_2$ barrier layers 334b and 334a).

Figure 3K:
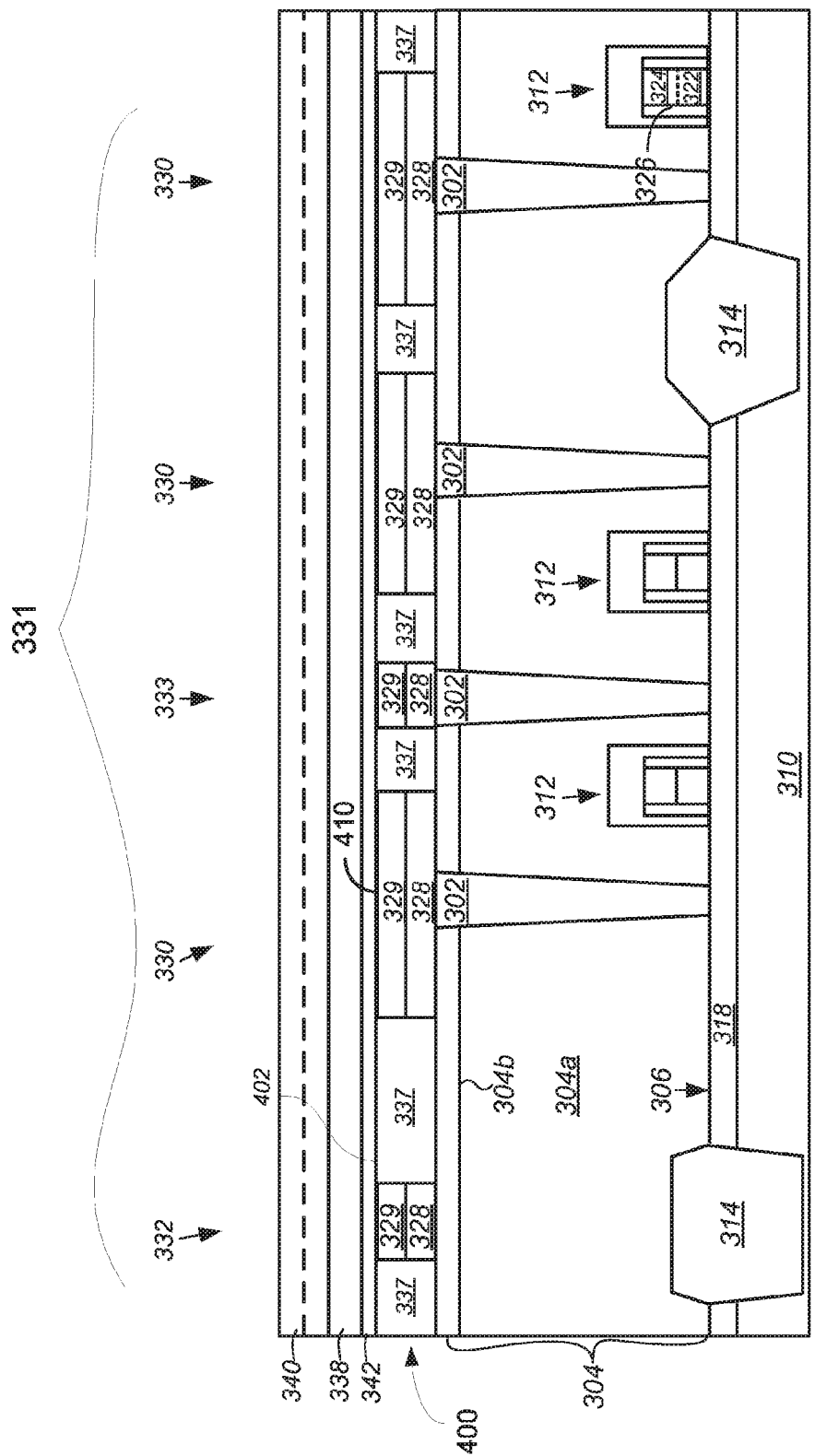

Referring to FIG. 2A and FIG. 3K, layers of a ferro stack from which at least a portion of a ferroelectric capacitor will be formed are deposited or formed over the planarized top barrier surface 402 of the preformed or pre-patterned barrier structure 400. In one embodiment, the ferro stack layers includes a layer of a ferroelectric material, such as a lead zirconate titanate (PZT) ferroelectric layer 338, disposed between a top electrode 340 and thin bottom electrode (BE) transition layer 342. In one embodiment, thin BE transition layer 342 may be an electrical contact with or electrically coupled to one or more of the underlying first contact 302 through the electrically conductive material of the bottom electrode layer 329 and $O_2$ barrier layer 328 of the $O_2$ barrier/bottom electrode structures 330, and through the first contacts 302 to the diffusion region 318 of the MOS transistors 312.

In one embodiment, top electrode 340 may include one or more layers of iridium or iridium oxide having a combined thickness of from about 0.05 μm to about 0.20 μm, or other appropriate thicknesses, and deposited or formed using CVD, ALD or PVD. As shown in FIG. 3K, the top electrode 340 may be a multi-layer top electrode including, for example, a lower layer of iridium oxide ($IrO_2$) in contact with the PZT ferroelectric layer 338 and an upper layer of iridium (Ir) overlying the lower layer of the top electrode 340. The PZT ferroelectric layer 338 may be formed on the thin BE transition layer 342 to a thickness of from about 0.04 μm to about 0.10 μm, or other appropriate thicknesses, using CVD, ALD or PVD. The thin BE transition layer 342 may be disposed on the planarized top surface 402 of pre-patterned barrier structure 400. In one embodiment, thin BE transition layer 342 may include a thin layer of $IrO_2$ or Ir, deposited or formed using CVD, ALD or PVD. The thin BE transition layer 342 may have a thickness from about 5 nm to 30 nm, or other appropriate thicknesses, compared to a much thicker bottom electrode layer 329 having a thickness from about 60 nm to 360 nm, or other appropriate thicknesses, underneath it in the $O_2$ barrier/bottom electrode structures 330. The thickness ratio between the thin BE transition layer 342 and bottom electrode layer 329 is thus approximately 1:12. Since thin BE transition layer 342 and bottom electrode layer 329 are formed or patterned separately in at least two individual steps and the top surface of bottom electrode layer 329 was planarized or polished prior to the deposition of thin BE transition layer 342, there may be a bottom electrode interface 410 between the two layers 342 and 329. In one embodiment, the bottom electrode interface 410 may still be present even if thin BE transition layer 342 and bottom electrode layer 329 include similar building material, such as Ir. Thin BE transition layer 342 and bottom electrode layer 329 may be composed of different materials.

One of the functions of thin BE transition layer 342 in the disclosed fabrication process is to provide a physical barrier between PZT ferroelectric layer 338 and $H_2$ barrier structure 337 during the formation of ferro stack. PZT ferroelectric layer 338 may have chemical reaction with dielectric, such as oxide which may exist in $H_2$ barrier structure 337, and such chemical reaction may affect the integrity of PZT ferroelectric layer 338. Besides, thin BE transition layer 342 may provide a non-polished and fresh top surface, in contrast to the polished/planarized top surfaces of bottom electrode layer 329, to better receive the PZT ferroelectric layer 338 deposition. In the embodiment where thin BE transition layer 342 is excluded, planarized top surface 402 of the pre-patterned barrier structure 400, having gone through CMP process, may include a rough surface which may adversely affect PZT ferroelectric layer 338 deposition.

Figure 3L:
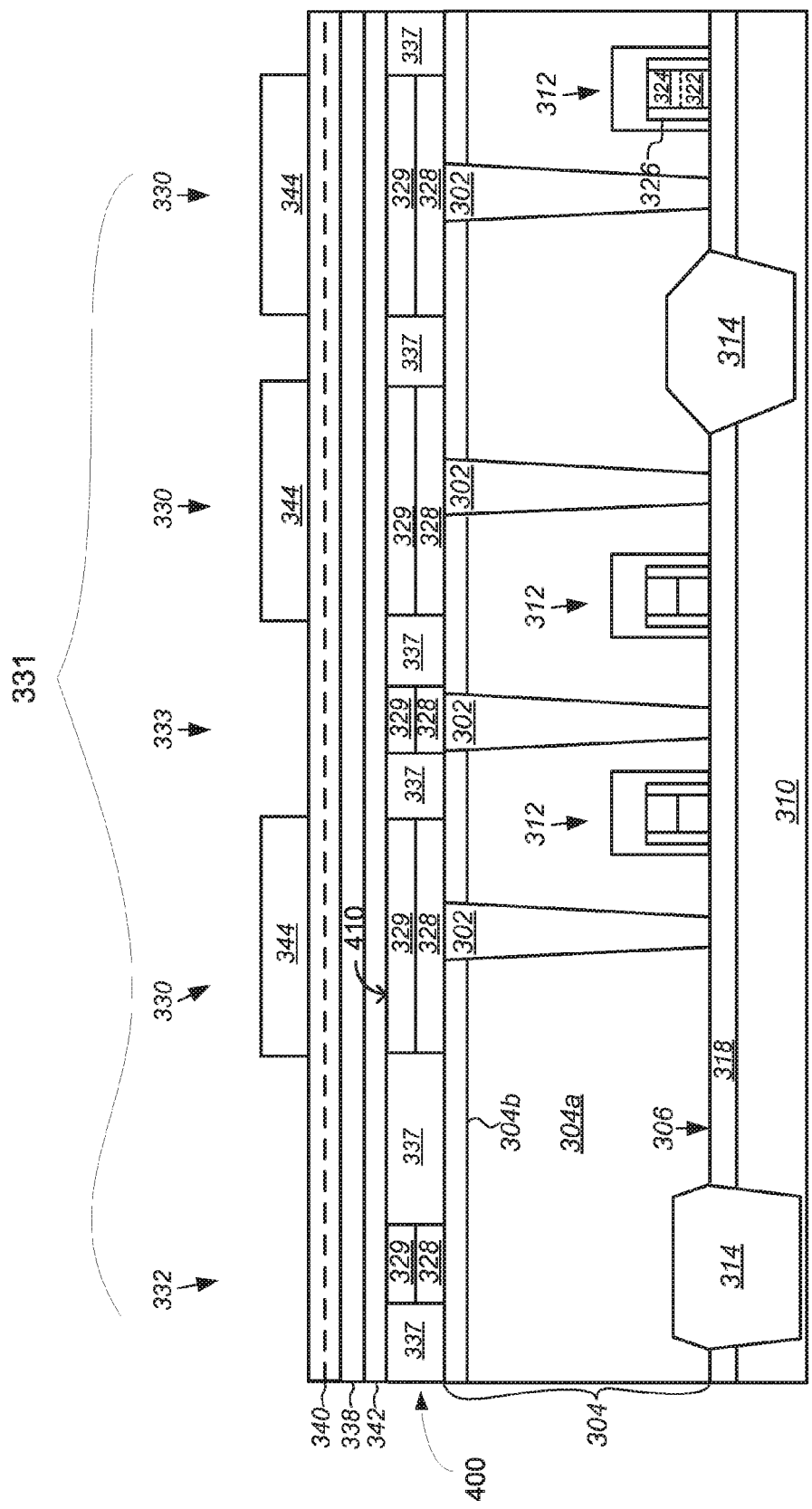

Referring to FIG. 2A and FIG. 3L, a patterned hardmask 344 is formed over the ferro-stack layers 338, 340, 342, using standard deposition, photolithographic and etching technologies (block 218). In certain embodiments, the hardmask 344 may include multiple layers and the material of the hardmask is selected to form a barrier, such as a hydrogen ($H_2$) barrier, that is left on the ferro-stack layers after etching to form a ferroelectric capacitor (not shown). The hardmask 344 may include, for example, a layer of titanium aluminum nitride (TiAlN) having a thickness of from about 0.15 to about 0.30 μm, or other appropriate thicknesses, and deposited or formed using a PVD process. Suitable chemistries and techniques for etching the hardmask 344 can include using a mixture of a fluorine based gas, such as sulfur hexafluoride ($SF_6$), nitrogen trifluoride ($NF_3$) or tetrafluoromethane ($CF_4$), a chlorine based gas, such as chlorine ($Cl_2$) or Boron Trichloride ($BCl_3$), and, optionally, an argon gas to increase the etch rate by sputtering.

Figure 3M:
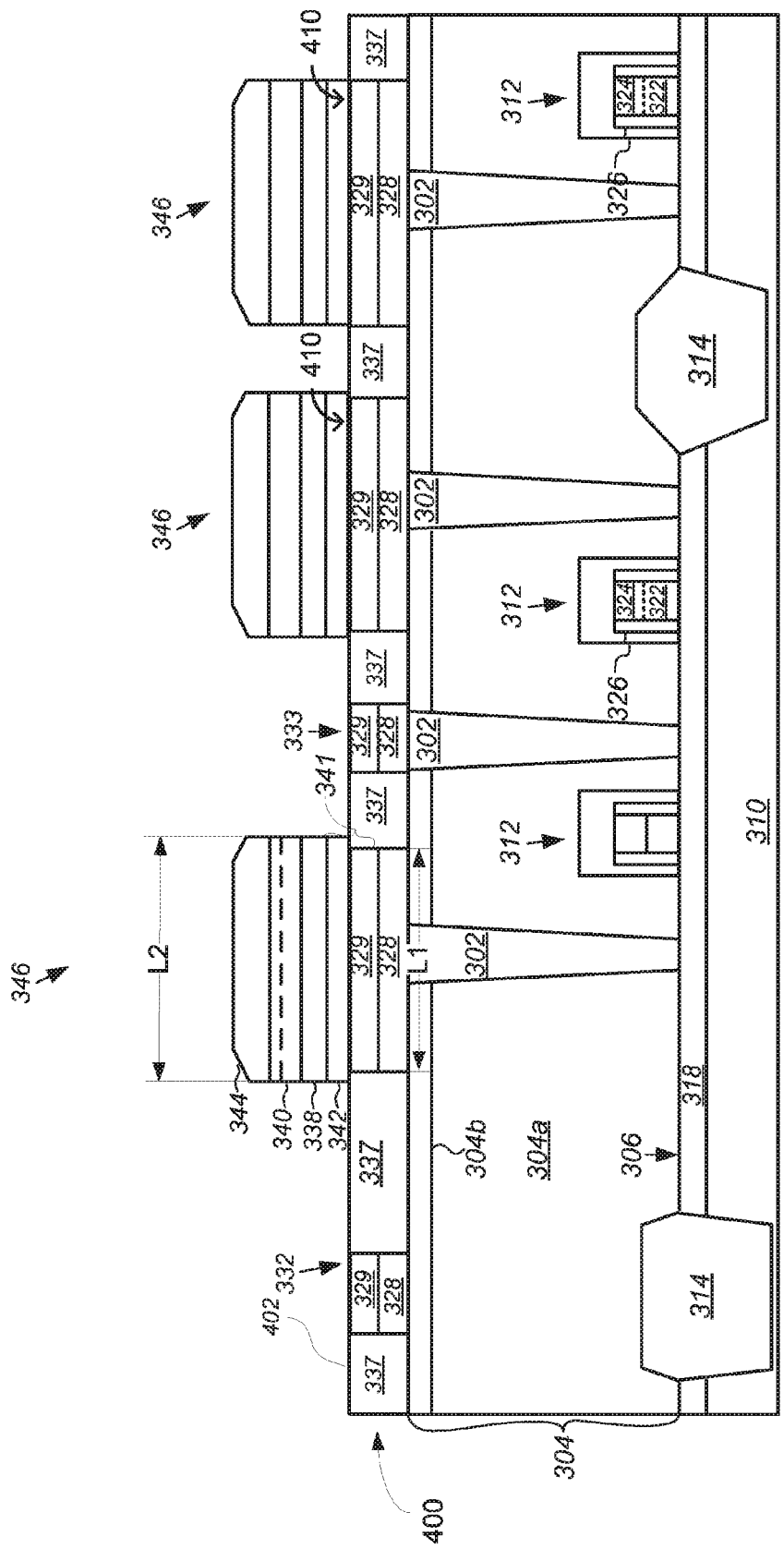

Next, referring to FIG. 2B and FIG. 3M, the ferro stack layers 338, 340, 342, are patterned using the patterned hardmask 344 and standard etching technologies to form a ferroelectric capacitor 346 over the previously fabricated $O_2$ barrier/bottom electrode structures 330 (block 220). In one embodiment, each ferroelectric capacitor 346 may include patterned hardmask 344, top electrode 340, PZT ferroelectric layer 338, and bottom electrode 341. As shown in FIG. 3M, bottom electrode 341 is a composite structure formed by thin BE transition layer 342 and bottom electrode layer 329 with a potential bottom electrode interface 410 in between. In one embodiment, the ratio of thicknesses of the thin BE transition layer 342 and bottom electrode layer 329 is in the approximate range of 1:12. The relatively significant difference in thicknesses may indicate that the function of bottom electrode 341, as one of the electrodes for ferroelectric capacitor 346, may be performed predominantly by bottom electrode layer 329. Besides, it will be understood that, in contrast to certain conventional embodiments, bottom electrode layer 329 and the rest of the ferroelectric capacitor 346 are patterned or etched or developed in at least two separated steps.

Suitable chemistries and techniques for etching the ferro stack layers 338, 340, 342 may include standard metal etch chemistries, including for example, high density plasma (HDP) etching, and various post-metal etch cleaning processes to prevent corrosion defects. It will be understood that a significant advantage of the method of the present disclosure is that because the ferroelectric capacitor 346 is formed over and with the pre-patterned $O_2$ barrier/bottom electrode structure 330, conductive residues formed during etching or patterning of layers to form the pre-patterned $O_2$ barrier/bottom electrode structure 330, especially the bottom electrode layer 329 composed of Ir or Pt, are not re-deposited on sidewalls of the ferroelectric capacitor 346. Patterning or etching thin BE transition layer 342 composed of Ir or $IrO_2$, which has a relatively small thickness, may cause fewer problems regarding conductive residues. Conductive residues on sidewalls of the ferroelectric capacitor 346 may form a high leakage path between bottom electrode 341 and top electrode 340, impairing operation of the ferroelectric capacitor 346, or, when the conductive residues are excessive, shorting the bottom electrode 341 and top electrode 340, rendering the ferroelectric capacitor 346 inoperative. It may also pose as a hurdle in etching process as conductive residues, such as Ir or $IrO_2$, are difficult to clean off sidewalls of ferroelectric capacitor 346. It will be understood that since the BE transition layer 342 is relatively thin, etching time for ferro stack layers 338, 340, 342 may be much reduced comparing to certain conventional embodiments. In one embodiment, the estimated damage in the PZT ferroelectric layer 338 caused by etching may be reduced due to shorter etching time. Patterning of ferro stack layers 338, 340, 342 is configured to stop at the top surface of the barrier structure.

In one embodiment, patterning in two separate steps, the length L2 of ferroelectric capacitor 346 may be configured correspondingly to the length L1 of pre-patterned $O_2$ barrier/bottom electrode structure 330 by adjusting the dimension of patterned hardmask 344. In some embodiments, ferro stack layers 338, 340, 342 may not have the same length. In those embodiments, length L2 of ferroelectric capacitor 346 may be referred to the length of thin BE transition layer 342.

Figure 3N:
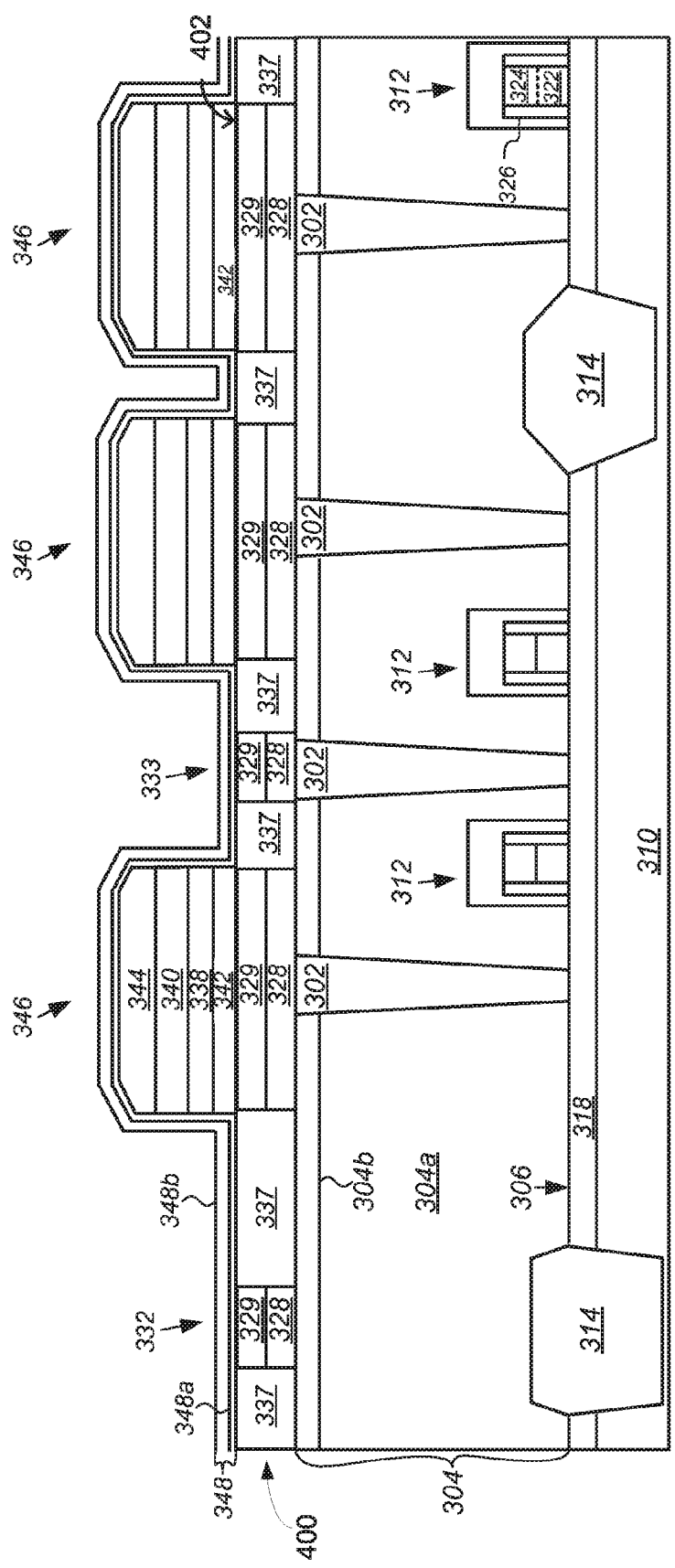

Referring to FIG. 2B and FIG. 3N, a $H_2$ barrier or $H_2$ encapsulation layer 348 is deposited over top surfaces and sidewalls of ferroelectric capacitors 346 and over the top surfaces of LI 332, landing pads 333, any exposed surface of the pre-patterned barrier structure 400 including $H_2$ barrier structures 337, substantially encapsulating the ferroelectric capacitors 346 (block 222). It has been observed that when any of the ferroelectric capacitor 346 is exposed to hydrogen introduced, for example during subsequent processing, the properties of the ferroelectric capacitor 346 may be severely degraded. The $H_2$ encapsulation layer 348 may include a single material layer, or multiple material layers. In one embodiment, such as that shown, $H_2$ encapsulation layer 348 may include a lower or first hydrogen encapsulation layer 348a of aluminum oxide ($Al_2O_3$) having a thickness of from about 100 Å to about 300 Å, or other appropriate thicknesses, and deposited by ALD, and an upper or second hydrogen encapsulation layer 348b of silicon nitride ($Si_xN_y$), having a thickness of from about 200 Å to about 1000 Å, or other appropriate thicknesses, and deposited by CVD or ALD.

Figure 3O:
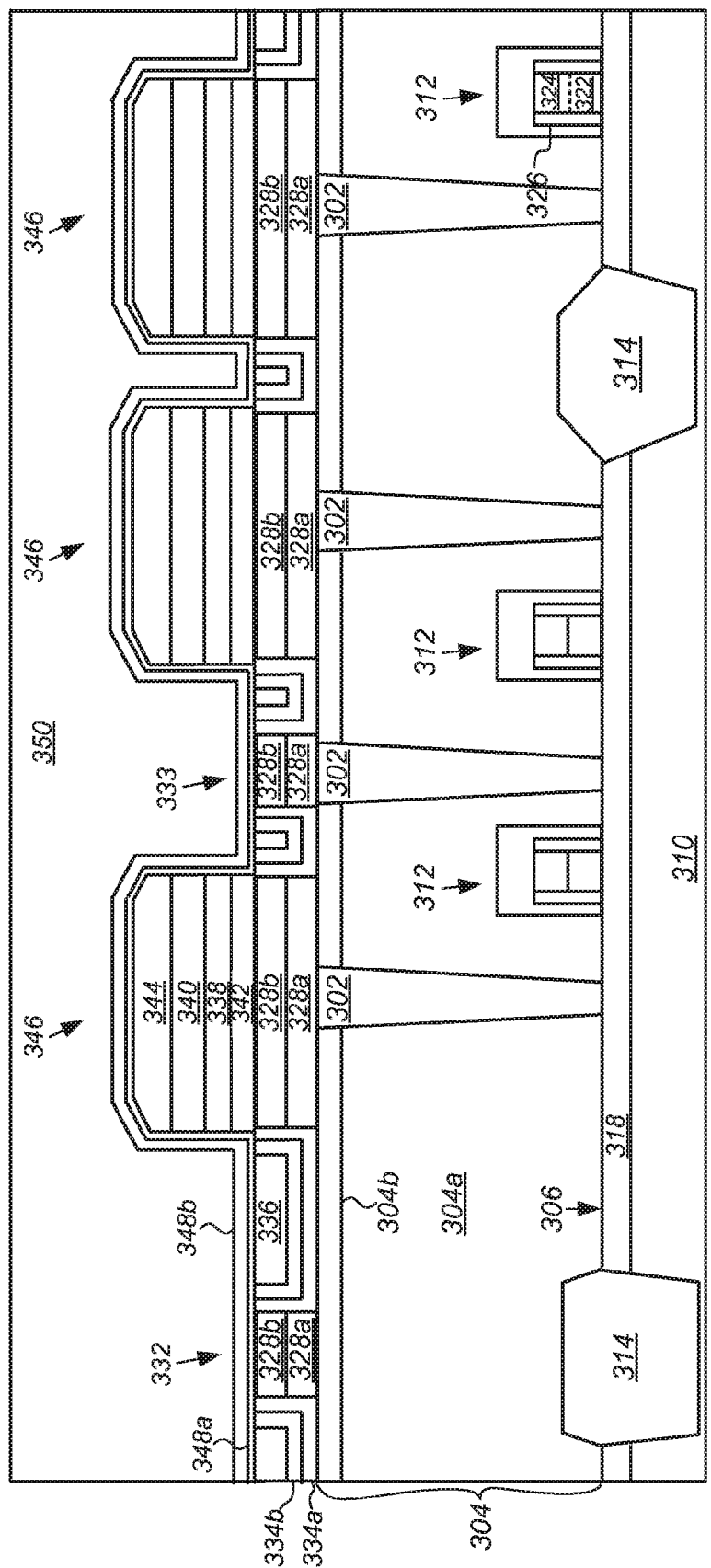

Referring to FIG. 2B and FIG. 3O, a third dielectric layer 350 or inter-layer dielectric (ILD) is deposited or formed over the $H_2$ encapsulation layer 348 and subsequently planarized (block 224). The third dielectric layer 350 may include one or more layers of an undoped oxide, such as silicon dioxide ($SiO_2$), a nitride, such as silicon nitride ($Si_xN_y$), a silicon oxynitride ($Si_xO_yN_z$) or, as with the first dielectric layer 304 described above an oxide, such as phosphosilicate glass (PSG). For example, in one embodiment the third dielectric layer 350 may include $SiO_2$ having a final, post CMP thickness of from about 0.1 to about 0.3 µm, or other appropriate thicknesses, from the top of the $H_2$ encapsulation layer 348, and deposited by LPCVD using tetraethyl orthosilicate, $Si(OC_2H_5)_4$ (TEOS).

Figure 3P:
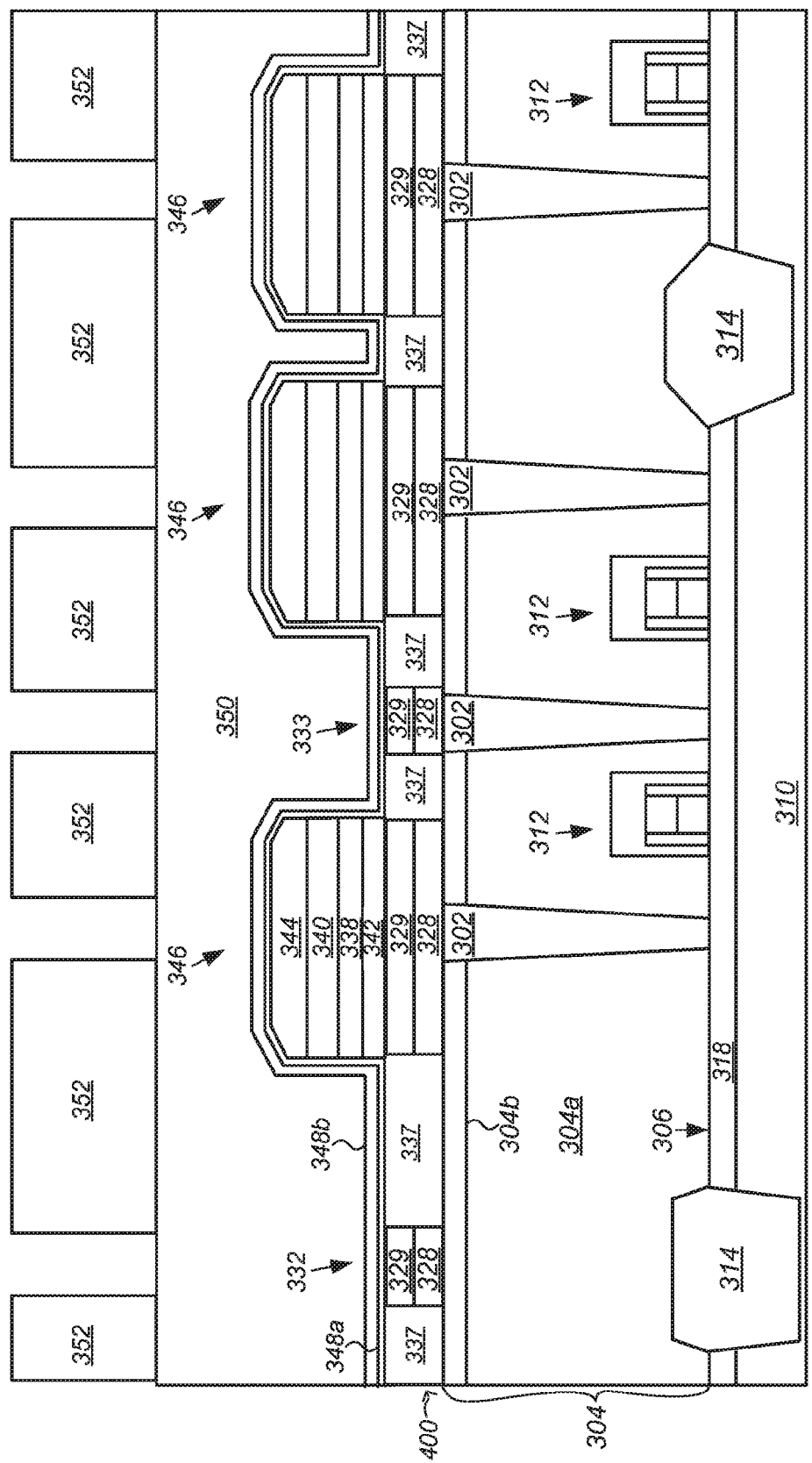
Figure 3Q:
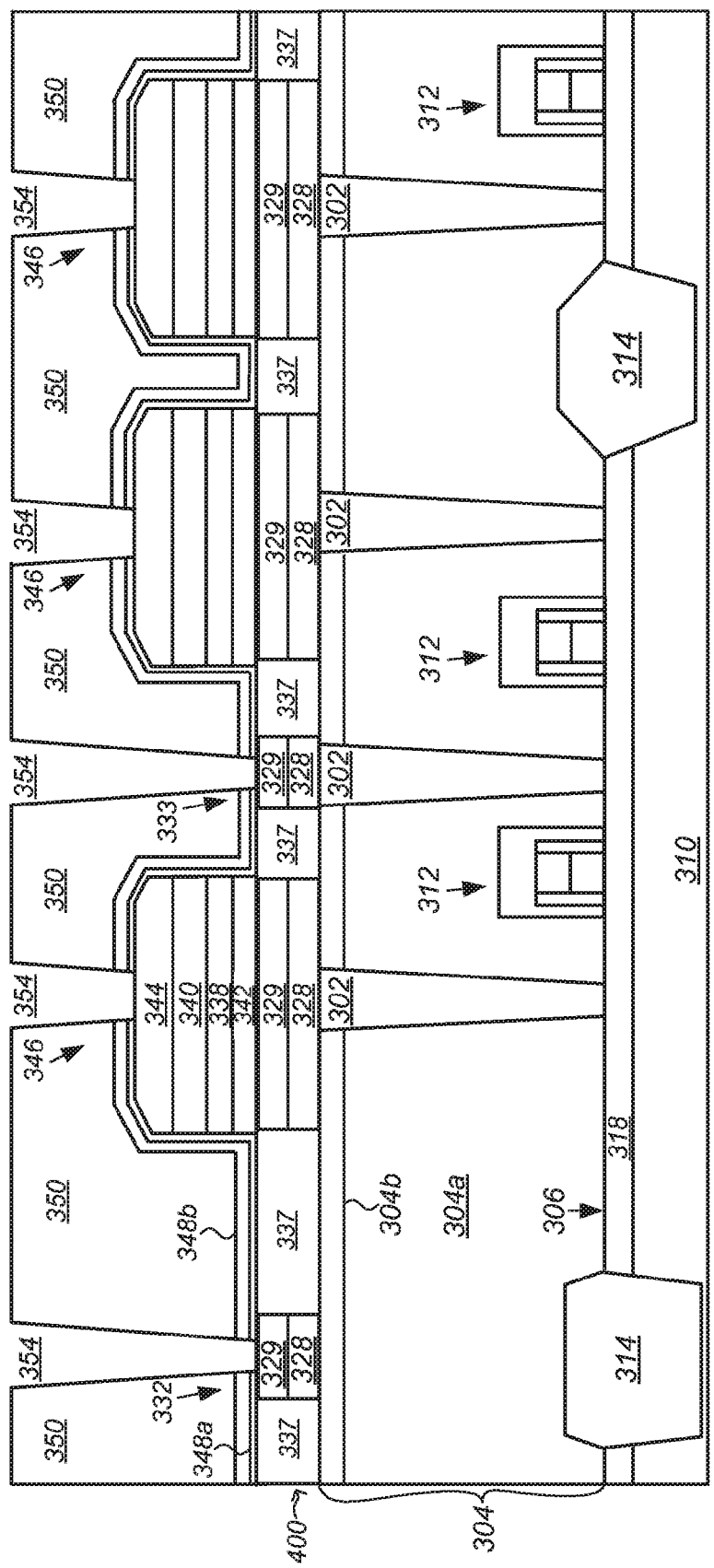
Figure 3R:
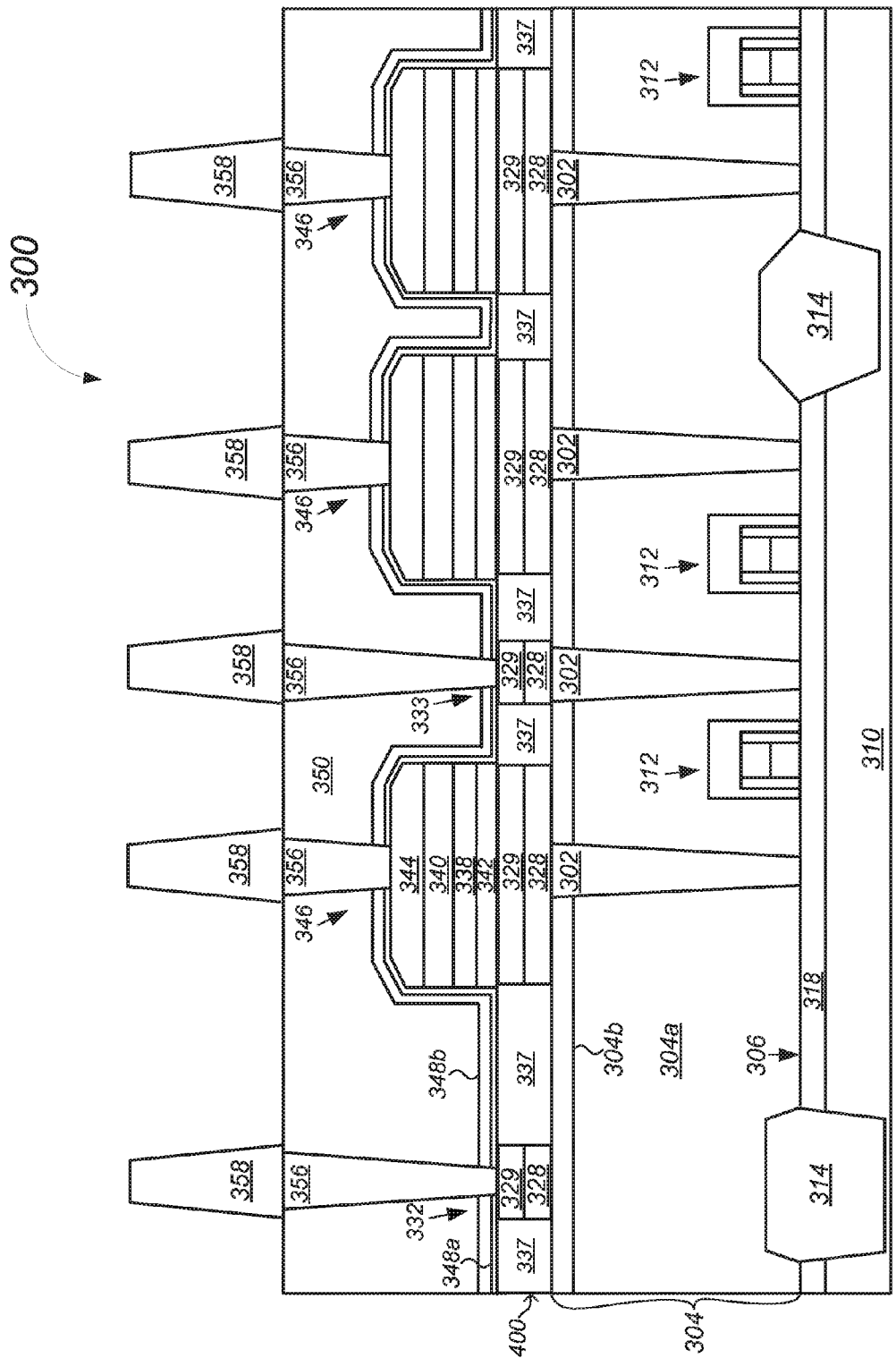

Next, referring to FIG. 2B and FIG. 3P a patterned mask layer 352 is formed on the third dielectric layer 350 (block 226). Now referring to FIG. 2B and FIG. 3Q, second contact openings 354 are etched through third dielectric layer 350 for ferro or second contacts (not shown in these figures) to electrically couple, through the hardmask 344, to the top electrode 340 of the ferroelectric capacitors 346, and to LI 332 and/or landing pads 333 using standard photolithographic and etching technologies (block 228). For third dielectric layer 350 composed of $SiO_2$, suitable masking and etching techniques may include forming a patterned photoresist layer, and etching the third dielectric layer 350 with an etch chemistry comprising carbon-monoxide (CO), argon (Ar), octafluorocyclobutane ($C_4F_8$) or Freon® C318, and, optionally, nitrogen ($N_2$).

Referring to FIG. 2B and FIG. 3R, a ferro contact openings 354 may be filled to form second or ferro contacts 356 (block 230). As with the first contacts 302 described above, the ferro contacts 356 may be formed by filling the contact openings with a refractory metal, such as titanium (Ti), tantalum (Ta), tungsten (W), and nitrides or alloys thereof, by physical vapor deposition, such as sputtering, evaporation or CVD. After filling the second contact openings 354, ferro contacts 356 and third dielectric layer 350 are planarized using, for example, a CMP process. FIG. 3R is a block diagram illustrating a cross-sectional view of a substantially completed portion of an F-RAM cell 300 including ferroelectric capacitors 346, and fabricated according to the method of FIGS. 2A and 2B.

Referring to FIG. 2B and again to FIG. 3R, a metal layer is deposited over the third dielectric layer 350 and masked and etched to form a plurality of first metallization (M1) layers 358 (block 232). Generally, M1 layers 358 may be or include aluminum, copper or alloys or mixtures thereof, and are deposited by PVD, such as sputtering, evaporation, or electroless plating to a thickness of from about 1000 Å to about 5000 Å, or other appropriate thicknesses. In one embodiment, the metal layer is patterned to form M1 layers 358 using standard photolithographic and metal etching techniques, including for example, high density plasma (HDP) etching, and various post-metal etch cleaning processes to prevent corrosion defects.

It will be understood by those skilled in the art that the embodiment of a method of manufacturing or fabricating an F-RAM cell including embedded or integrally formed ferroelectric capacitor and CMOS transistors described above advantageously minimizes changes to the standard complementary metal-oxide-semiconductor (CMOS) process flow, including the addition of just two additional mask steps, thereby reducing cost of fabricating ferroelectric random access memories (F-RAM). In the embodiment illustrated in FIG. 3R as an example, a land pad 333 is disposed between two ferroelectric capacitors 346.

It will be further understood that a number of layers in the completed ferroelectric capacitor 346 is reduced by at least one layer, i.e., $O_2$ barrier and bottom electrode layer 329 that are typically formed and patterned with the ferro stack layers formed in a conventional method, and a stack height of the ferroelectric capacitor is reduced by about 50% over, those formed by conventional methods.

In addition, the challenge of etching the ferro stack layers 338, 340, 342 is reduced due to the change in aspect ratio, enabling the sidewalls of the ferroelectric capacitors 346 to be more vertical, and providing a larger cap size (top surface of the ferroelectric capacitors 346) for the same design layout, or smaller gap/pitch distance between two ferroelectric capacitors 346, or ferroelectric capacitors 346 of the same top surface size may be disposed closer together. For example, based on a 130 nm process requirements, the distance/pitch between ferroelectric capacitors 346 may be reduced from about 180 nm to about 145 nm, which may contributed to an approximate 5% in F-RAM cell size shrinkage, or an approximate 15% in total memory cell size shrinkage. In addition to the above, the thinner third dielectric layer 350 enables a lower aspect ratio for the second or ferro contacts 356, facilitating contact etch and fill, and increasing a yield of working devices. Finally, it is noted that by forming the LI 332 and landing pads 333 from the patterned O₂ barrier stacks 331, it substantially eliminates the potential for oxidizing metal used in the underlying first contacts 302 during subsequent processing. Moreover, it may eliminate the need to etch deep vias that penetrate both third dielectric layer 350 and first dielectric layer 304 to get access to diffusion layer 318.

Figure 4:
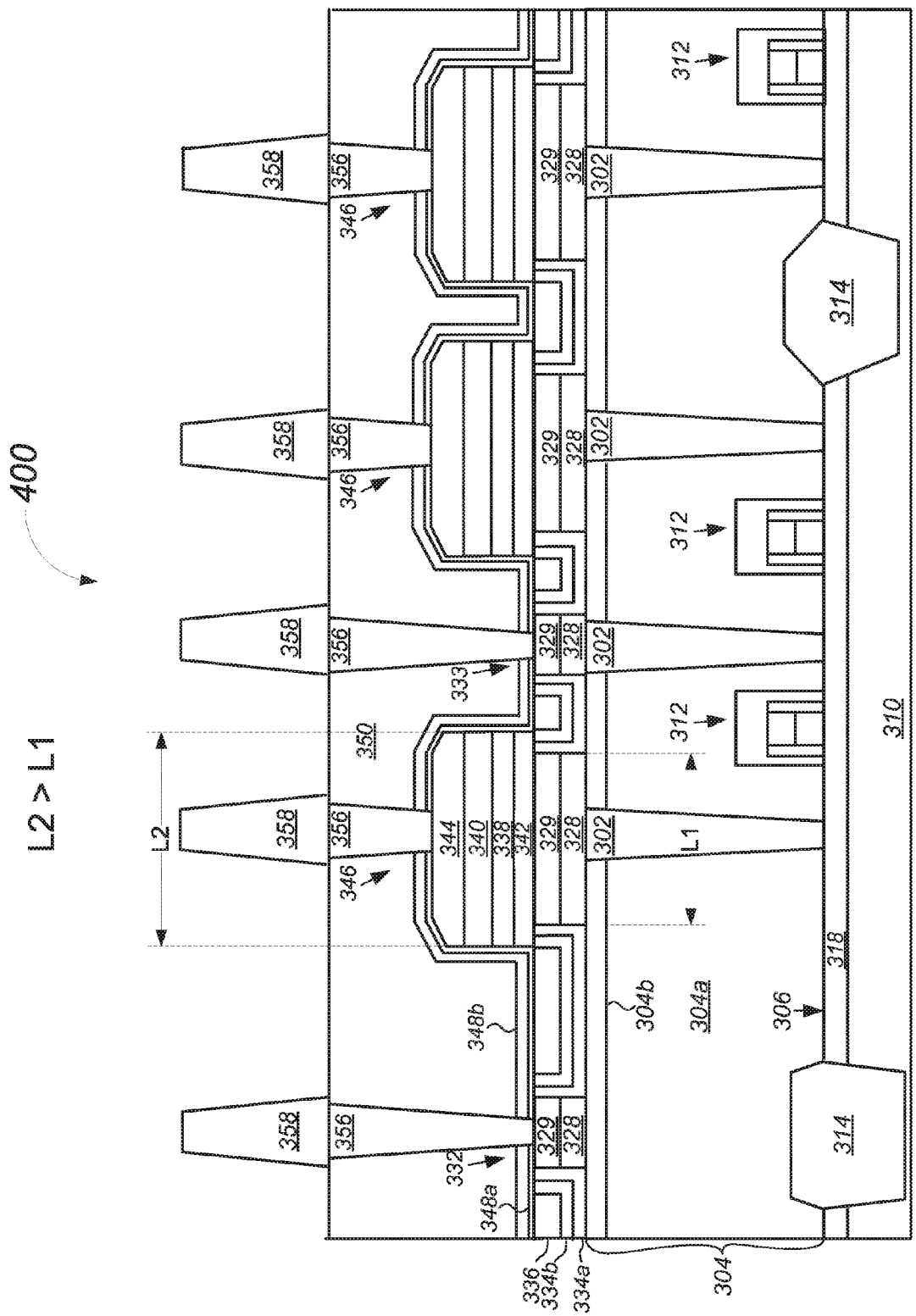
FIG. 4 is a block diagram illustrating a cross-sectional view of a portion of an F-RAM cell fabricated according to one alternative embodiment of the method of FIGS. 2A and 2B.

FIG. 4 is a block diagram illustrating a cross-sectional view of a portion of a completed F-RAM 400 fabricated according to an alternate embodiment of the method of FIGS. 2A-2B and 3A-3R. Referring to FIG. 4, in this embodiment, patterning the ferro-stack to form the ferroelectric capacitor 346 over the previously fabricated O₂ barrier/bottom electrode structure 330, block 220, comprises patterning the ferro-stack to form thin bottom electrode 342 having a larger length L2 than the length L1 of the O₂ barrier/bottom electrode structure 330. In one embodiment, thin BE transition layer 342 may be partially disposed and have direct contact with H₂ barrier structures 337. It will be understood by those skilled in the art that this embodiment wherein the O₂ barrier/bottom electrode structure 330 has a smaller dimension compared to thin BE transition layer 342 of the ferroelectric capacitor 346 will improve the misalignment tolerance, thereby facilitating the fabrication processes and increasing a yield of the working devices. Moreover, as shown in FIG. 4, F-RAM 400 may include H₂ barrier structures 337 adopting the embodiment of 337*d* in FIG. 3J, in which H₂ barrier structures 337 include first and second hydrogen barrier layers 334*a*, 334*b* and second dielectric layer 336. It will be understood that other embodiments, such as those best shown in FIG. 3J including 337*a*, 337*b*, 337*c* and 337*d* may be adopted in F-RAM 400.

Figure 5:
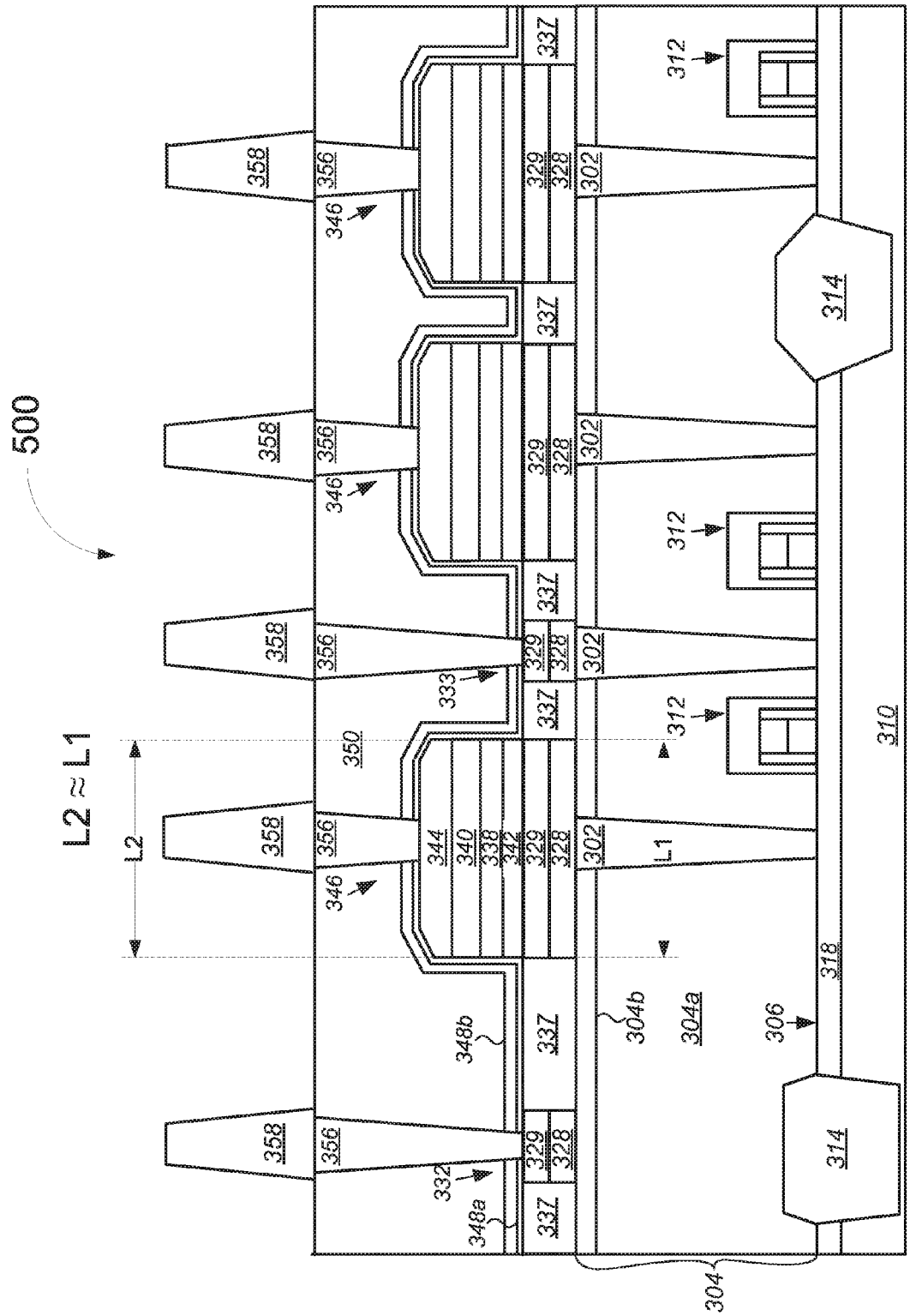
FIG. 5 is a block diagram illustrating a cross-sectional view of a portion of an F-RAM cell fabricated according to another alternative embodiment of the method of FIGS. 2A and 2B.

FIG. 5 is a block diagram illustrating a cross-sectional view of a portion of a completed F-RAM 500 fabricated according to another alternate embodiment of the method of FIGS. 2A-2B and 3A-3R. Referring to FIG. 5, in this embodiment, the patterning the ferro-stack to form the ferroelectric capacitor 346 over the previously fabricated O₂ barrier/bottom electrode structure 330, block 220, comprises patterning the ferro-stack to form thin bottom electrode 342 having a similar length L2 to the length L1 of the O₂ barrier/bottom electrode structure 330. Besides, thin BE transition layer 342 is patterned to align with the previously fabricated O₂ barrier/bottom electrode structure 330. In one embodiment, if the O₂ barrier/bottom electrode structure 330 include a thickness of 1700 Å, or other appropriate thicknesses, the misalignment tolerance between the thin BE transition layer 342 and O₂ barrier/bottom electrode structure 330 will be from about 296 Å to 590 Å.

Thus, embodiments of ferroelectric random access memories including embedded or integrally formed F-RAM capacitors and CMOS transistors and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory device, comprising:
a barrier layer including a patterned barrier structure, wherein the patterned barrier structure comprises a first electrode layer disposed over an oxygen (02) barrier layer; and
a patterned ferroelectric stack disposed at least partly over the patterned barrier structure, wherein the patterned ferroelectric stack includes a second electrode layer disposed over a ferroelectric layer,
wherein the first electrode layer of the patterned barrier structure, the ferroelectric and second electrode layers of the patterned ferroelectric stack form a ferroelectric capacitor.

2. The memory device of claim 1, wherein the barrier layer is disposed over a first contact and a first dielectric layer.

3. The memory device of claim 1, wherein the patterned ferroelectric stack further includes a transition layer, including at least one of iridium and iridium oxide, disposed underneath the ferroelectric layer, wherein the transition layer includes a thickness in an approximate range of 5 nm to 30 nm, and wherein a ratio between the thickness of the transition layer and a thickness of the first electrode layer is 1:12.

4. The memory device of claim 1, wherein the barrier layer further comprises at least one first hydrogen barrier structure including a silicon nitride layer, the at least one first hydrogen barrier structure disposed in contact with at least one sidewall of the patterned barrier structure.

5. The memory device of claim 4, wherein the barrier layer includes a planarized top surface exposing a top surface of the patterned barrier structure and the at least one first hydrogen barrier structure.

6. The memory device of claim 1, wherein the first electrode layer includes at least one of iridium (Ir) and platinum (Pt).

7. The memory device of claim 1, wherein the O₂ barrier layer comprises multiple layers, and wherein the multiple layers comprise a first O₂ barrier layer including titanium nitride (TiN), and a second O₂ barrier layer including titanium-aluminum-nitride (TiAlN) disposed over the first O₂ barrier layer.

8. The memory device of claim 1, wherein the O₂ barrier layer includes a titanium-aluminum-oxynitride (TiAlO$_x$N$_y$) layer, wherein the TiAlO$_x$N$_y$ layer is oxygen-rich proximate to a top surface of the O₂ barrier layer and nitrogen-rich proximate to a bottom surface of the O₂ barrier layer.

9. The memory device of claim 4, wherein the at least one first hydrogen barrier layer includes multiple layers, wherein the multiple layers include at least the silicon nitride layer disposed over a layer of aluminum oxide.

10. The memory device of claim 4, further comprises:
a second hydrogen barrier layer, comprising at least one of TiN and TiAlN, disposed over the ferroelectric capacitor;
a second dielectric layer disposed over the second hydrogen barrier layer; and
a second contact extending from a planarized top surface of the second dielectric layer to the second electrode layer of the ferroelectric capacitor.

11. The memory device of claim 3, wherein the first electrode layer of the patterned barrier structure includes a first length (L1) and the transition layer of the patterned ferroelectric stack includes a second length (L2), and wherein L2 is greater than L1.

12. The memory device of claim 3, wherein the first electrode layer of the patterned barrier structure includes a first length (L1) and the transition layer of the patterned ferroelectric stack includes a second length (L2), wherein L2 approximately equals to L1.

13. A device, comprising:
a first dielectric layer disposed over a substrate to encapsulate at least a portion of a complementary metal-oxide-semiconductor (CMOS) circuit formed on the substrate;
a pre-patterned barrier structure disposed over the first dielectric layer, wherein the pre-patterned barrier structure comprises a plurality of bottom electrode (BE)/oxygen ($O_2$) barrier structures and a plurality of hydrogen ($H_2$) barrier structures, wherein each BE/$O_2$ barrier structure includes a bottom electrode (BE) layer formed over an $O_2$ barrier layer, and wherein each BE/$O_2$ barrier structure is formed between two adjacent $H_2$ barrier structures, and wherein the pre-patterned barrier structure includes a planarized common surface exposing a top surface of the plurality of BE/$O_2$ barrier structures; and
a patterned ferroelectric stack disposed over a corresponding BE/$O_2$ barrier structure to form a ferroelectric capacitor.

14. The device of claim 13, wherein the patterned ferroelectric stack includes a top electrode (TE) layer over a ferroelectric layer and a bottom electrode (BE) transition layer, and wherein the patterned BE transition layer and the BE layer thereunder form a bottom electrode of the ferroelectric capacitor.

15. The device of claim 13, wherein the each of the plurality of $H_2$ barrier structures is in contact with at least one sidewall of one of the plurality of BE/$O_2$ structures.

16. The device of claim 14, wherein each of the patterned BE transition layers includes a second length (L2) and the BE layer thereunder includes a first length (L1), and wherein L2 is greater than L1.

17. The device of claim 14, wherein each of the patterned BE transition layers includes a second length (L2) and the BE layer thereunder includes a first length (L1), and wherein L2 is approximately the same as L1.

18. A device, comprising:
a first dielectric layer disposed over a substrate to encapsulate at least a portion of a complementary metal-oxide-semiconductor (CMOS) circuit formed on the substrate;
a barrier layer including a patterned barrier structure, a local interconnection (LI), and a landing pad, wherein the patterned barrier structure, the LI, and the landing pad each comprises a first electrode layer disposed over an oxygen ($O_2$) barrier layer; and
a patterned ferroelectric stack disposed at least partly over the patterned barrier structure, wherein the patterned ferroelectric stack includes a second electrode layer disposed over a ferroelectric layer, and wherein the first electrode layer of the patterned barrier structure, the ferroelectric and second electrode layers of the patterned ferroelectric stack form a ferroelectric capacitor.

19. The device of claim 18, further comprising:
a second dielectric layer disposed over the barrier layer to encapsulate the ferroelectric capacitor, the LI, and the landing pad;
a plurality of first contacts disposed at least partly within the first dielectric layer connecting one of the patterned barrier structure and the landing pad to the CMOS circuit; and
a plurality of second contacts disposed at least partly within the second dielectric layer connecting one of the ferroelectric capacitor, the LI, and the landing pad to a metallization layer.

20. The device of claim 18, wherein the patterned ferroelectric stack further includes a transition layer, including at least one of iridium and iridium oxide, disposed underneath the ferroelectric layer, wherein the transition layer includes a thickness in an approximate range of 5 nm to 30 nm, and wherein a ratio between the thickness of the transition layer and a thickness of the first electrode layer of the patterned barrier structure is 1:12.

* * * * *